(12) United States Patent
Shokrollahi

(10) Patent No.: US 9,985,745 B2
(45) Date of Patent: May 29, 2018

(54) VECTOR SIGNALING WITH REDUCED RECEIVER COMPLEXITY

(71) Applicant: Kandou Labs, S.A., Lausanne (CH)

(72) Inventor: Amin Shokrollahi, Preverenges (CH)

(73) Assignee: KANDOU LABS, S.A., Lausanne (CH)

( * ) Notice: Subject to any disclaimer, the term of this patent is extended or adjusted under 35 U.S.C. 154(b) by 0 days. days.

(21) Appl. No.: 15/635,012

(22) Filed: Jun. 27, 2017

(65) Prior Publication Data

US 2017/0294985 A1    Oct. 12, 2017

Related U.S. Application Data

(63) Continuation of application No. 15/340,415, filed on Nov. 1, 2016, now Pat. No. 9,692,555, which is a continuation of application No. 15/006,736, filed on Jan. 26, 2016, now Pat. No. 9,485,057, which is a continuation of application No. 14/313,966, filed on Jun. 24, 2014, now Pat. No. 9,246,713.

(60) Provisional application No. 61/839,360, filed on Jun. 25, 2013.

(51) Int. Cl.
*H04L 1/00* (2006.01)
*H04L 17/18* (2006.01)

(52) U.S. Cl.
CPC .......... *H04L 1/0052* (2013.01); *H04L 1/0054* (2013.01); *H04L 17/18* (2013.01)

(58) Field of Classification Search
CPC ...... H04L 1/0052; H04L 1/0054; H04L 17/18
See application file for complete search history.

(56) References Cited

U.S. PATENT DOCUMENTS

| 668,687 | A | 2/1901 | Mayer |
| 780,883 | A | 1/1905 | Hinchman |
| 3,196,351 | A | 7/1965 | Slepian |
| 3,636,463 | A | 1/1972 | Ongkiehong |
| 3,939,468 | A | 2/1976 | Mastin |
| 4,163,258 | A | 7/1979 | Ebihara |
| 4,181,967 | A | 1/1980 | Nash |
| 4,206,316 | A | 6/1980 | Burnsweig |
| 4,276,543 | A | 6/1981 | Miller |
| 4,486,739 | A | 12/1984 | Franaszek |
| 4,499,550 | A | 2/1985 | Ray, III |
| 4,722,084 | A | 1/1988 | Morton |
| 4,772,845 | A | 9/1988 | Scott |

(Continued)

FOREIGN PATENT DOCUMENTS

| CN | 1864346 | 11/2006 |
| CN | 101478286 | 7/2009 |

(Continued)

OTHER PUBLICATIONS

"Introduction to: Analog Computers and the DSPACE System," Course Material ECE 5230 Spring 2008, Utah State University, www.coursehero.com, 12 pages.

(Continued)

*Primary Examiner* — Leon Flores
(74) *Attorney, Agent, or Firm* — Invention Mine, LLC

(57) ABSTRACT

Methods and apparatuses are described to determine subsets of vector signaling codes capable of detection by smaller sets of comparators than required to detect the full code. The resulting lower receiver complexity allows systems utilizing such subset codes to be less complex and require less power.

10 Claims, 19 Drawing Sheets

(56) References Cited

U.S. PATENT DOCUMENTS

| | | |
|---|---|---|
| 4,774,498 A | 9/1988 | Traa |
| 4,864,303 A | 9/1989 | Ofek |
| 4,897,657 A | 1/1990 | Brubaker |
| 4,974,211 A | 11/1990 | Corl |
| 5,017,924 A | 5/1991 | Guiberteau |
| 5,053,974 A | 10/1991 | Penz |
| 5,166,956 A | 11/1992 | Baltus |
| 5,168,509 A | 12/1992 | Nakamura |
| 5,266,907 A | 11/1993 | Dacus |
| 5,283,761 A | 2/1994 | Gillingham |
| 5,287,305 A | 2/1994 | Yoshida |
| 5,311,516 A | 5/1994 | Kuznicki |
| 5,331,320 A | 7/1994 | Cideciyan |
| 5,412,689 A | 5/1995 | Chan |
| 5,449,895 A | 9/1995 | Hecht |
| 5,459,465 A | 10/1995 | Kagey |
| 5,461,379 A | 10/1995 | Weinman |
| 5,510,736 A | 4/1996 | Van De Plassche |
| 5,511,119 A | 4/1996 | Lechleider |
| 5,553,097 A | 9/1996 | Dagher |
| 5,566,193 A | 10/1996 | Cloonan |
| 5,599,550 A | 2/1997 | Kohlruss |
| 5,626,651 A | 5/1997 | Dullien |
| 5,629,651 A | 5/1997 | Mizuno |
| 5,659,353 A | 8/1997 | Kostreski |
| 5,727,006 A | 3/1998 | Dreyer |
| 5,748,948 A | 5/1998 | Yu |
| 5,802,356 A | 9/1998 | Gaskins |
| 5,825,808 A | 10/1998 | Hershey |
| 5,856,935 A | 1/1999 | Moy |
| 5,875,202 A | 2/1999 | Venters |
| 5,945,935 A | 8/1999 | Kusumoto |
| 5,949,060 A | 9/1999 | Schattschneider |
| 5,982,954 A | 11/1999 | Delen |
| 5,995,016 A | 11/1999 | Perino |
| 6,005,895 A | 12/1999 | Perino |
| 6,084,883 A | 7/2000 | Norrell |
| 6,119,263 A | 9/2000 | Mowbray |
| 6,172,634 B1 | 1/2001 | Leonowich |
| 6,175,230 B1 | 1/2001 | Hamblin |
| 6,232,908 B1 | 5/2001 | Nakaigawa |
| 6,278,740 B1 | 8/2001 | Nordyke |
| 6,316,987 B1 | 11/2001 | Dally |
| 6,346,907 B1 | 2/2002 | Dacy |
| 6,359,931 B1 | 3/2002 | Perino |
| 6,378,073 B1 | 4/2002 | Davis |
| 6,384,758 B1 | 5/2002 | Michalski |
| 6,398,359 B1 | 6/2002 | Silverbrook |
| 6,404,820 B1 | 6/2002 | Postol |
| 6,417,737 B1 | 7/2002 | Moloudi |
| 6,433,800 B1 | 8/2002 | Holtz |
| 6,452,420 B1 | 9/2002 | Wong |
| 6,473,877 B1 | 10/2002 | Sharma |
| 6,483,828 B1 | 11/2002 | Balachandran |
| 6,504,875 B2 | 1/2003 | Perino |
| 6,509,773 B2 | 1/2003 | Buchwald |
| 6,522,699 B1 | 2/2003 | Anderson |
| 6,556,628 B1 | 4/2003 | Poulton |
| 6,563,382 B1 | 5/2003 | Yang |
| 6,621,427 B2 | 9/2003 | Greenstreet |
| 6,624,699 B2 | 9/2003 | Yin |
| 6,650,638 B1 | 11/2003 | Walker |
| 6,661,355 B2 | 12/2003 | Cornelius |
| 6,664,355 B2 | 12/2003 | Kim |
| 6,686,879 B2 | 2/2004 | Shattil |
| 6,690,739 B1 | 2/2004 | Mui |
| 6,766,342 B2 | 7/2004 | Kechriotis |
| 6,772,351 B1 | 8/2004 | Werner |
| 6,839,429 B1 | 1/2005 | Gaikwad |
| 6,839,587 B2 | 1/2005 | Yonce |
| 6,854,030 B2 | 2/2005 | Perino |
| 6,865,234 B1 | 3/2005 | Agazzi |
| 6,865,236 B1 | 3/2005 | Terry |
| 6,876,317 B2 | 4/2005 | Sankaran |
| 6,898,724 B2 | 5/2005 | Chang |
| 6,927,709 B2 | 8/2005 | Kiehl |
| 6,954,492 B1 | 10/2005 | Williams |
| 6,963,622 B2 | 11/2005 | Eroz |
| 6,972,701 B2 | 12/2005 | Jansson |
| 6,973,613 B2 | 12/2005 | Cypher |
| 6,976,194 B2 | 12/2005 | Cypher |
| 6,982,954 B2 | 1/2006 | Dhong |
| 6,990,138 B2 | 1/2006 | Bejjani |
| 6,993,311 B2 * | 1/2006 | Li .................... H04H 40/63 375/232 |
| 6,999,516 B1 | 2/2006 | Rajan |
| 7,023,817 B2 | 4/2006 | Kuffner |
| 7,039,136 B2 | 5/2006 | Olson |
| 7,053,802 B2 | 5/2006 | Cornelius |
| 7,075,996 B2 | 7/2006 | Simon |
| 7,080,288 B2 | 7/2006 | Ferraiolo |
| 7,082,557 B2 | 7/2006 | Schauer |
| 7,085,153 B2 | 8/2006 | Ferrant |
| 7,085,336 B2 | 8/2006 | Lee |
| 7,127,003 B2 | 10/2006 | Rajan |
| 7,130,944 B2 | 10/2006 | Perino |
| 7,142,612 B2 | 11/2006 | Horowitz |
| 7,142,865 B2 | 11/2006 | Tsai |
| 7,164,631 B2 | 1/2007 | Tateishi |
| 7,167,019 B2 | 1/2007 | Broyde |
| 7,176,823 B2 | 2/2007 | Zabroda |
| 7,180,949 B2 | 2/2007 | Kleveland |
| 7,184,483 B2 | 2/2007 | Rajan |
| 7,199,728 B2 | 4/2007 | Dally |
| 7,231,558 B2 | 6/2007 | Gentieu |
| 7,269,130 B2 | 9/2007 | Pitio |
| 7,269,212 B1 | 9/2007 | Chau |
| 7,335,976 B2 | 2/2008 | Chen |
| 7,336,112 B1 | 2/2008 | Sha |
| 7,339,990 B2 | 3/2008 | Hidaka |
| 7,346,819 B2 | 3/2008 | Bansal |
| 7,348,989 B2 | 3/2008 | Stevens |
| 7,349,484 B2 | 3/2008 | Stojanovic |
| 7,356,213 B1 | 4/2008 | Cunningham |
| 7,358,869 B1 | 4/2008 | Chiarulli |
| 7,362,130 B2 | 4/2008 | Broyde |
| 7,362,697 B2 | 4/2008 | Becker |
| 7,366,942 B2 | 4/2008 | Lee |
| 7,370,264 B2 | 5/2008 | Worley |
| 7,372,390 B2 | 5/2008 | Yamada |
| 7,389,333 B2 | 6/2008 | Moore |
| 7,397,302 B2 | 7/2008 | Bardsley |
| 7,400,276 B1 | 7/2008 | Sotiriadis |
| 7,428,273 B2 | 9/2008 | Foster |
| 7,456,778 B2 | 11/2008 | Werner |
| 7,462,956 B2 | 12/2008 | Lan |
| 7,496,162 B2 | 2/2009 | Srebranig |
| 7,570,704 B2 | 4/2009 | Nagarajan |
| 7,535,957 B2 | 5/2009 | Ozawa |
| 7,539,532 B2 | 5/2009 | Tran |
| 7,599,390 B2 | 10/2009 | Pamarti |
| 7,613,234 B2 | 11/2009 | Raghavan |
| 7,616,075 B2 | 11/2009 | Kushiyama |
| 7,620,116 B2 | 11/2009 | Bessios |
| 7,633,850 B2 | 12/2009 | Nagarajan |
| 7,639,596 B2 | 12/2009 | Cioffi |
| 7,643,588 B2 | 1/2010 | Visalli |
| 7,650,525 B1 | 1/2010 | Chang |
| 7,656,321 B2 | 2/2010 | Wang |
| 7,694,204 B2 | 4/2010 | Schmidt |
| 7,697,915 B2 | 4/2010 | Behzad |
| 7,698,088 B2 | 4/2010 | Sul |
| 7,706,456 B2 | 4/2010 | Laroia |
| 7,706,524 B2 | 4/2010 | Zerbe |
| 7,746,764 B2 | 6/2010 | Rawlins |
| 7,768,312 B2 | 8/2010 | Hirose |
| 7,787,572 B2 | 8/2010 | Scharf |
| 7,804,361 B2 | 9/2010 | Lim |
| 7,808,456 B2 | 10/2010 | Chen |
| 7,808,883 B2 | 10/2010 | Green |
| 7,841,909 B2 | 11/2010 | Murray |
| 7,869,497 B2 | 1/2011 | Benvenuto |
| 7,869,546 B2 | 1/2011 | Tsai |
| 7,882,413 B2 | 2/2011 | Chen |

(56) References Cited

U.S. PATENT DOCUMENTS

| | | |
|---|---|---|
| 7,899,653 B2 | 3/2011 | Hollis |
| 7,907,676 B2 | 3/2011 | Stojanovic |
| 7,933,770 B2 | 4/2011 | Kruger |
| 8,000,664 B2 | 8/2011 | Khorram |
| 8,030,999 B2 | 10/2011 | Chatterjee |
| 8,036,300 B2 | 10/2011 | Evans |
| 8,050,332 B2 | 11/2011 | Chung |
| 8,055,095 B2 | 11/2011 | Palotai |
| 8,064,535 B2 | 11/2011 | Wiley |
| 8,085,172 B2 | 12/2011 | Li |
| 8,091,006 B2 | 1/2012 | Prasad |
| 8,106,806 B2 | 1/2012 | Toyomura |
| 8,149,906 B2 | 4/2012 | Saito |
| 8,159,375 B2 * | 4/2012 | Abbasfar ............ H03M 7/20 341/50 |
| 8,159,376 B2 | 4/2012 | Abbasfar |
| 8,180,931 B2 | 5/2012 | Lee |
| 8,185,807 B2 | 5/2012 | Oh |
| 8,199,849 B2 | 6/2012 | Oh |
| 8,199,863 B2 | 6/2012 | Chen |
| 8,218,670 B2 | 7/2012 | AbouRjeily |
| 8,233,544 B2 | 7/2012 | Bao |
| 8,245,094 B2 | 8/2012 | Jiang |
| 8,253,454 B2 | 8/2012 | Lin |
| 8,279,094 B2 | 10/2012 | Abbasfar |
| 8,279,745 B2 | 10/2012 | Dent |
| 8,289,914 B2 | 10/2012 | Li |
| 8,295,250 B2 | 10/2012 | Gorokhov |
| 8,295,336 B2 | 10/2012 | Lutz |
| 8,305,247 B2 | 11/2012 | Pun |
| 8,310,389 B1 | 11/2012 | Chui |
| 8,341,492 B2 | 12/2012 | Shen |
| 8,359,445 B2 | 1/2013 | Ware |
| 8,365,035 B2 | 1/2013 | Hara |
| 8,406,315 B2 | 3/2013 | Tsai |
| 8,406,316 B2 | 3/2013 | Sugita |
| 8,429,492 B2 | 4/2013 | Yoon |
| 8,429,495 B2 | 4/2013 | Przybylski |
| 8,437,440 B1 | 5/2013 | Zhang |
| 8,442,099 B1 | 5/2013 | Sederat |
| 8,442,210 B2 | 5/2013 | Zerbe |
| 8,443,223 B2 | 5/2013 | Abbasfar |
| 8,451,913 B2 | 5/2013 | Oh |
| 8,462,891 B2 | 6/2013 | Kizer |
| 8,472,513 B2 | 6/2013 | Malipatil |
| 8,620,166 B2 | 6/2013 | Dong |
| 8,498,344 B2 | 7/2013 | Wilson |
| 8,498,368 B1 | 7/2013 | Husted |
| 8,520,348 B2 | 8/2013 | Dong |
| 8,520,493 B2 | 8/2013 | Goulahsen |
| 8,539,318 B2 | 9/2013 | Cronie |
| 8,547,272 B2 | 10/2013 | Nestler |
| 8,577,284 B2 | 11/2013 | Seo |
| 8,578,246 B2 | 11/2013 | Mittelholzer |
| 8,588,254 B2 | 11/2013 | Diab |
| 8,588,280 B2 | 11/2013 | Oh |
| 8,593,305 B1 | 11/2013 | Tajalli |
| 8,602,643 B2 | 12/2013 | Gardiner |
| 8,604,879 B2 | 12/2013 | Mourant |
| 8,638,241 B2 | 1/2014 | Sudhakaran |
| 8,643,437 B2 | 2/2014 | Chiu |
| 8,649,445 B2 | 2/2014 | Cronie |
| 8,649,460 B2 | 2/2014 | Ware |
| 8,674,861 B2 | 3/2014 | Matsuno |
| 8,687,968 B2 | 4/2014 | Nosaka |
| 8,711,919 B2 | 4/2014 | Kumar |
| 8,718,184 B1 | 5/2014 | Cronie |
| 8,755,426 B1 | 6/2014 | Cronie |
| 8,773,964 B2 | 7/2014 | Hsueh |
| 8,780,687 B2 | 7/2014 | Clausen |
| 8,782,578 B2 | 7/2014 | Tell |
| 8,831,440 B2 | 9/2014 | Yu |
| 8,841,936 B2 | 9/2014 | Nakamura |
| 8,879,660 B1 | 11/2014 | Peng |
| 8,897,134 B2 | 11/2014 | Kern |
| 8,898,504 B2 | 11/2014 | Baumgartner |
| 8,938,171 B2 | 1/2015 | Tang |
| 8,949,693 B2 | 2/2015 | Ordentlich |
| 8,951,072 B2 | 2/2015 | Hashim |
| 8,975,948 B2 | 3/2015 | GonzalezDiaz |
| 8,989,317 B1 | 3/2015 | Holden |
| 9,015,566 B2 | 4/2015 | Cronie |
| 9,020,049 B2 | 4/2015 | Schwager |
| 9,036,764 B1 | 5/2015 | Hossain |
| 9,059,816 B1 | 6/2015 | Simpson |
| 9,069,995 B1 | 6/2015 | Cronie |
| 9,077,386 B1 | 7/2015 | Holden |
| 9,083,576 B1 | 7/2015 | Hormati |
| 9,093,791 B2 | 7/2015 | Liang |
| 9,100,232 B1 | 8/2015 | Hormati |
| 9,106,465 B2 | 8/2015 | Walter |
| 9,124,557 B2 | 9/2015 | Fox |
| 9,148,087 B1 | 9/2015 | Tajalli |
| 9,152,495 B2 | 10/2015 | Losh |
| 9,165,615 B2 | 10/2015 | Amirkhany |
| 9,172,412 B2 | 10/2015 | Kim |
| 9,178,503 B2 | 11/2015 | Hsieh |
| 9,183,085 B1 | 11/2015 | Northcott |
| 9,197,470 B2 | 11/2015 | Okunev |
| 9,281,785 B2 | 3/2016 | Sjoland |
| 9,288,082 B1 | 3/2016 | Ulrich |
| 9,288,089 B2 | 3/2016 | Cronie |
| 9,292,716 B2 | 3/2016 | Winoto |
| 9,300,503 B1 | 3/2016 | Holden |
| 9,306,621 B2 | 4/2016 | Zhang |
| 9,331,962 B2 | 5/2016 | Lida |
| 9,362,974 B2 | 6/2016 | Fox |
| 9,363,114 B2 | 6/2016 | Shokrollahi |
| 9,374,250 B1 | 6/2016 | Musah |
| 9,401,828 B2 | 7/2016 | Cronie |
| 9,432,082 B2 | 8/2016 | Ulrich |
| 9,432,298 B1 | 8/2016 | Smith |
| 9,444,654 B2 | 9/2016 | Hormati |
| 9,455,744 B2 | 9/2016 | George |
| 9,455,765 B2 | 9/2016 | Schumacher |
| 9,461,862 B2 | 10/2016 | Holden |
| 9,479,369 B1 | 10/2016 | Shokrollahi |
| 9,509,437 B2 | 11/2016 | Shokrollahi |
| 9,544,015 B2 | 1/2017 | Ulrich |
| 9,634,797 B2 | 4/2017 | Benammar |
| 2001/0006538 A1 | 7/2001 | Simon |
| 2001/0055344 A1 | 12/2001 | Lee |
| 2002/0034191 A1 | 3/2002 | Shattil |
| 2002/0044316 A1 | 4/2002 | Myers |
| 2002/0057592 A1 | 5/2002 | Robb |
| 2002/0154633 A1 | 10/2002 | Shin |
| 2002/0163881 A1 | 11/2002 | Dhong |
| 2002/0167339 A1 | 11/2002 | Chang |
| 2002/0174373 A1 | 11/2002 | Chang |
| 2002/0181607 A1 | 12/2002 | Izumi |
| 2003/0016763 A1 | 1/2003 | Doi |
| 2003/0016770 A1 | 1/2003 | Trans |
| 2003/0046618 A1 | 3/2003 | Collins |
| 2003/0085763 A1 | 5/2003 | Schrodinger |
| 2003/0146783 A1 | 8/2003 | Bandy |
| 2003/0174023 A1 | 9/2003 | Miyasita |
| 2003/0185310 A1 | 10/2003 | Ketchum |
| 2003/0218558 A1 | 11/2003 | Mulder |
| 2004/0027185 A1 | 2/2004 | Fiedler |
| 2004/0146117 A1 | 7/2004 | Subramaniam |
| 2004/0155802 A1 | 8/2004 | Lamy |
| 2004/0161019 A1 | 8/2004 | Raghavan |
| 2004/0169529 A1 | 9/2004 | Afghahi |
| 2005/0063493 A1 | 3/2005 | Foster |
| 2005/0134380 A1 | 6/2005 | Nairn |
| 2005/0174841 A1 | 8/2005 | Ho |
| 2005/0195000 A1 | 9/2005 | Parker |
| 2005/0201491 A1 | 9/2005 | Wei |
| 2005/0213686 A1 | 9/2005 | Love |
| 2005/0220182 A1 | 10/2005 | Kuwata |
| 2005/0270098 A1 | 12/2005 | Zhang |
| 2006/0036668 A1 | 2/2006 | Jaussi |
| 2006/0097786 A1 | 5/2006 | Su |
| 2006/0103463 A1 | 5/2006 | Lee |

(56) References Cited

U.S. PATENT DOCUMENTS

| | | |
|---|---|---|
| 2006/0120486 A1 | 6/2006 | Visalli |
| 2006/0126751 A1 | 6/2006 | Bessios |
| 2006/0133538 A1 | 6/2006 | Stojanovic |
| 2006/0140324 A1 | 6/2006 | Casper |
| 2006/0159005 A1 | 7/2006 | Rawlins |
| 2006/0233291 A1 | 10/2006 | Garlepp |
| 2007/0001723 A1 | 1/2007 | Lin |
| 2007/0002954 A1 | 1/2007 | Cornelius |
| 2007/0030796 A1 | 2/2007 | Green |
| 2007/0103338 A1 | 5/2007 | Teo |
| 2007/0121716 A1 | 5/2007 | Nagarajan |
| 2007/0182487 A1 | 8/2007 | Ozasa |
| 2007/0201546 A1 | 8/2007 | Lee |
| 2007/0204205 A1 | 8/2007 | Niu |
| 2007/0263711 A1 | 11/2007 | Kramer |
| 2007/0283210 A1 | 12/2007 | Prasad |
| 2008/0007367 A1 | 1/2008 | Kim |
| 2008/0012598 A1 | 1/2008 | Mayer |
| 2008/0104374 A1 | 5/2008 | Mohamed |
| 2008/0159448 A1 | 7/2008 | Anim-Appiah |
| 2008/0192621 A1 | 8/2008 | Suehiro |
| 2008/0317188 A1 | 12/2008 | Staszewski |
| 2009/0059782 A1 | 3/2009 | Cole |
| 2009/0115523 A1 | 5/2009 | Akizuki |
| 2009/0154604 A1 | 6/2009 | Lee |
| 2009/0195281 A1 | 8/2009 | Tamura |
| 2009/0262876 A1 | 10/2009 | Arima |
| 2009/0316730 A1 | 12/2009 | Feng |
| 2009/0323864 A1 | 12/2009 | Tired |
| 2010/0046644 A1 | 2/2010 | Mazet |
| 2010/0081451 A1 | 4/2010 | Mueck |
| 2010/0148819 A1 | 6/2010 | Bae |
| 2010/0180143 A1 | 7/2010 | Ware |
| 2010/0215087 A1 | 8/2010 | Tsai |
| 2010/0215112 A1 | 8/2010 | Tsai |
| 2010/0235673 A1 | 9/2010 | Abbasfar |
| 2010/0271107 A1 | 10/2010 | Tran |
| 2010/0283894 A1 | 11/2010 | Horan |
| 2010/0296556 A1 | 11/2010 | Rave |
| 2010/0309904 A1 | 12/2010 | Oh |
| 2011/0014865 A1 | 1/2011 | Seo |
| 2011/0028089 A1 | 2/2011 | Komori |
| 2011/0032977 A1 | 2/2011 | Hsiao |
| 2011/0051854 A1 | 3/2011 | Kizer |
| 2011/0072330 A1 | 3/2011 | Kolze |
| 2011/0074488 A1 | 3/2011 | Broyde |
| 2011/0084737 A1 | 4/2011 | Oh |
| 2011/0103508 A1 | 5/2011 | Mu |
| 2011/0127990 A1 | 6/2011 | Wilson |
| 2011/0228864 A1 | 9/2011 | Aryanfar |
| 2011/0235501 A1 | 9/2011 | Goulahsen |
| 2011/0268225 A1 | 11/2011 | Cronie |
| 2011/0299555 A1 | 12/2011 | Cronie |
| 2011/0302478 A1 | 12/2011 | Cronie |
| 2011/0317559 A1 | 12/2011 | Kern |
| 2012/0082203 A1 | 4/2012 | Zerbe |
| 2012/0133438 A1 | 5/2012 | Tsuchi |
| 2012/0152901 A1 | 6/2012 | Nagorny |
| 2012/0161945 A1 | 6/2012 | Single |
| 2012/0213299 A1 | 8/2012 | Cronie |
| 2012/0257683 A1 | 10/2012 | Schwager |
| 2013/0010892 A1 | 1/2013 | Cronie |
| 2013/0013870 A1 | 1/2013 | Cronie |
| 2013/0106513 A1 | 5/2013 | Cyrusian |
| 2013/0114519 A1 | 5/2013 | Gaal |
| 2013/0114663 A1 | 5/2013 | Ding |
| 2013/0129019 A1 | 5/2013 | Sorrells |
| 2013/0147553 A1 | 6/2013 | Iwamoto |
| 2013/0188656 A1 | 7/2013 | Ferraiolo |
| 2013/0195155 A1 | 8/2013 | Pan |
| 2013/0202065 A1 | 8/2013 | Chmelar |
| 2013/0215954 A1 | 8/2013 | Beukema |
| 2013/0259113 A1 | 10/2013 | Kumar |
| 2013/0271194 A1 | 10/2013 | Pellerano |
| 2013/0307614 A1 | 11/2013 | Dai |
| 2013/0314142 A1 | 11/2013 | Tamura |
| 2013/0315501 A1 | 11/2013 | Atanassov |
| 2013/0346830 A1 | 12/2013 | Ordentlich |
| 2014/0159769 A1 | 6/2014 | Hong |
| 2014/0177645 A1 | 6/2014 | Cronie |
| 2014/0177696 A1 | 6/2014 | Hwang |
| 2014/0266440 A1 | 9/2014 | Itagaki |
| 2014/0269130 A1 | 9/2014 | Maeng |
| 2015/0049798 A1 | 2/2015 | Hossein |
| 2015/0070201 A1 | 3/2015 | Dedic |
| 2015/0078479 A1 | 3/2015 | Whitby-Strevens |
| 2015/0146771 A1 | 5/2015 | Walter |
| 2015/0222458 A1 | 8/2015 | Hormati |
| 2015/0249559 A1 | 9/2015 | Shokrollahi |
| 2015/0333940 A1 | 11/2015 | Shokrollahi |
| 2015/0349835 A1 | 12/2015 | Fox |
| 2015/0380087 A1 | 12/2015 | Mittelholzer |
| 2015/0381232 A1 | 12/2015 | Ulrich |
| 2016/0020796 A1 | 1/2016 | Hormati |
| 2016/0020824 A1 | 1/2016 | Ulrich |
| 2016/0036616 A1 | 2/2016 | Holden |
| 2016/0197747 A1 | 7/2016 | Ulrich |
| 2016/0261435 A1 | 9/2016 | Musah |
| 2017/0310456 A1 | 10/2017 | Tajalli |
| 2017/0317449 A1 | 11/2017 | Shokrollahi |
| 2017/0317855 A1 | 11/2017 | Shokrollahi |

FOREIGN PATENT DOCUMENTS

| | | |
|---|---|---|
| EP | 1926267 | 5/2008 |
| EP | 2039221 | 2/2013 |
| JP | 2003163612 | 6/2003 |
| WO | 2005002162 | 1/2005 |
| WO | 2009084121 | 7/2009 |
| WO | 2010031824 | 3/2010 |
| WO | 2011119359 | 9/2011 |

OTHER PUBLICATIONS

Abbasfar, A., "Generalized Differential Vector Signaling", IEEE International Conference on Communications, ICC '09, (Jun. 14, 2009), pp. 1-5.

Brown, L., et al., "V.92: The Last Dial-Up Modem?", IEEE Transactions on Communications, IEEE Service Center, Piscataway, NJ., USA, vol. 52, No. 1, Jan. 1, 2004, pp. 54-61. XP011106836, ISSN: 0090-6779, DOI: 10.1109/tcomm.2003.822168, pp. 55-59.

Burr, "Spherical Codes for M-ARY Code Shift Keying", University of York, Apr. 2, 1989, pp. 67-72, United Kingdom.

Cheng, W., "Memory Bus Encoding for Low Power: A Tutorial", Quality Electronic Design, IEEE, International Symposium on Mar. 26-28, 2001, pp. 199-204, Piscataway, NJ.

Clayton, P., "Introduction to Electromagnetic Compatibility", Wiley-Interscience, 2006.

Counts, L., et al., "One-Chip Slide Rule Works with Logs, Antilogs for Real-Time Processing," Analog Devices Computational Products 6, Reprinted from Electronic Design, May 2, 1985, 7 pages.

Dasilva et al., "Multicarrier Orthogonal CDMA Signals for Quasi-Synchronous Communication Systems", IEEE Journal on Selected Areas in Communications, vol. 12, No. 5 (Jun. 1, 1994), pp. 842-852.

Design Brief 208 Using the Anadigm Multiplier CAM, Copyright 2002 Anadigm, 6 pages.

Ericson, T., et al., "Spherical Codes Generated by Binary Partitions of Symmetric Pointsets", IEEE Transactions on Information Theory, vol. 41, No. 1, Jan. 1995, pp. 107-129.

Farzan, K., et al., "Coding Schemes for Chip-to-Chip Interconnect Applications", IEEE Transactions on Very Large Scale Integration (VLSI) Systems, vol. 14, No. 4, Apr. 2006, pp. 393-406.

Grahame, J., "Vintage Analog Computer Kits," posted on Aug. 25, 2006 in Classic Computing, 2 pages, http://www.retrothing.com/2006/08/classic_analog_.html.

Healey, A., et al., "A Comparison of 25 Gbps NRZ & PAM-4 Modulation used in Legacy & Premium Backplane Channels", DesignCon 2012, 16 pages.

(56) References Cited

OTHER PUBLICATIONS

International Search Report and Written Opinion for PCT/EP2011/059279 dated Sep. 22, 2011.
International Search Report and Written Opinion for PCT/EP2011/074219 dated Jul. 4, 2012.
International Search Report and Written Opinion for PCT/EP2012/052767 dated May 11, 2012.
International Search Report and Written Opinion for PCT/US14/052986 dated Nov. 24, 2014.
International Search Report and Written Opinion from PCT/US2014/034220 dated Aug. 21, 2014.
International Search Report and Written Opinion of the International Searching Authority, dated Jul. 14, 2011 in International Patent Application S.N. PCT/EP2011/002170, 10 pages.
International Search Report and Written Opinion of the International Searching Authority, dated Nov. 5, 2012, in International Patent Application S.N. PCT/EP2012/052767, 7 pages.
International Search Report for PCT/US2014/053563, dated Nov. 11, 2014, 2 pages.
Jiang, A., et al., "Rank Modulation for Flash Memories", IEEE Transactions of Information Theory, Jun. 2006, vol. 55, No. 6, pp. 2659-2673.
Loh, M., et al., "A 3×9 Gb/s Shared, All-Digital CDR for High-Speed, High-Density I/O", Matthew Loh, IEEE Journal of Solid-State Circuits, Vo. 47, No. 3, Mar. 2012.
Notification of Transmittal of International Search Report and the Written Opinion of the International Searching Authority, for PCT/US2015/018363, dated Jun. 18, 2015, 13 pages.
Notification of Transmittal of the International Search Report and the Written Opinion of the International Searching Authority, or the Declaration for PCT/EP2013/002681, dated Feb. 25, 2014, 15 pages.
Notification of Transmittal of the International Search Report and the Written Opinion of the International Searching Authority, or the Declaration, dated Mar. 3, 2015, for PCT/US2014/066893, 9 pages.
Notification of Transmittal of the International Search Report and the Written Opinion of the International Searching Authority, or the Declaration, for PCT/US2014/015840, dated May 20, 2014. 11 pages.
Notification of Transmittal of the International Search Report and the Written Opinion of the International Searching Authority, or the Declaration, for PCT/US2014/043965, dated Oct. 22, 2014, 10 pages.
Notification of Transmittal of the International Search Report and the Written Opinion of the International Searching Authority, or the Declaration, for PCT/US2015/037466, dated Nov. 19, 2015.
Notification of Transmittal of the International Search Report and the Written Opinion of the International Searching Authority, or the Declaration, for PCT/US2015/039952, dated Sep. 23, 2015, 8 pages.
Notification of Transmittal of the International Search Report and the Written Opinion of the International Searching Authority, or the Declaration, for PCT/US2015/041161, dated Oct. 7, 2015, 8 pages.
Notification of Transmittal of the International Search Report and the Written Opinion of the International Searching Authority, or the Declaration, for PCT/US2015/043463, dated Oct. 16, 2015, 8 pages.
Oh, et al., Pseudo-Differential Vector Signaling for Noise Reduction in Single-Ended Signaling, DesignCon 2009.
Poulton, et al., "Multiwire Differential Signaling", UNC-CH Department of Computer Science Version 1.1, Aug. 6, 2003.
Schneider, J., et al., "ELEC301 Project: Building an Analog Computer," Dec. 19, 1999, 8 pages, http://www.clear.rice.edu/elec301/Projects99/anlgcomp/.
She et al., "A Framework of Cross-Layer Superposition Coded Multicast for Robust IPTV Services over WiMAX," IEEE Communications Society subject matter experts for publication in the WCNC 2008 proceedings, Mar. 31, 2008-Apr. 3, 2008, pp. 3139-3144.
Skliar et al., A Method for the Analysis of Signals: the Square-Wave Method, Mar. 2008, Revista de Matematica: Teoria y Aplicaciones, pp. 109-129.
Slepian, D., "Premutation Modulation", IEEE, vol. 52, No. 3, Mar. 1965, pp. 228-236.
Stan, M., et al., "Bus-Invert Coding for Low-Power I/O, IEEE Transactions on Very Large Scale Integration (VLSI) Systems", vol. 3, No. 1, Mar. 1995, pp. 49-58.
Tallini, L., et al., "Transmission Time Analysis for the Parallel Asynchronous Communication Scheme", IEEE Transactions on Computers, vol. 52, No. 5, May 2003, pp. 558-571.
Tierney, J., et al., "A digital frequency synthesizer," Audio and Electroacoustics, IEEE Transactions, Mar. 1971, pp. 48-57, vol. 19, Issue 1, 1 page Abstract from http://ieeexplore.
Wang et al., "Applying CDMA Technique to Network-on-Chip", IEEE Transactions on Very Large Scale Integration (VLSI) Systems, vol. 15, No. 10 (Oct. 1, 2007), pp. 1091-1100.
Zouhair Ben-Neticha et al, "The streTched-Golay and other codes for high-SNR fnite-delay quantization of the Gaussian source at ½ Bit per sample", IEEE Transactions on Communications, vol. 38, No. 12 Dec. 1, 1990, pp. 2089-2093, XP000203339, ISSN: 0090-6678, DOI: 10.1109/26.64647.
Notification of Transmittal of the International Search Report and the Written Opinion of the International Searching Authority, or the Declaration, dated Feb. 15, 2017, 10 pages.
Notification of Transmittal of the International Search Report and the Written Opinion of the International Searching Authority, or the Declaration., for PCT/US17/14997, dated Apr. 7, 2017.
Holden, B., "Simulation results for NRZ, ENRZ & PAM-4 on 16-wire full-sized 400GE backplanes", IEEE 802.3 400GE Study Group, Sep. 2, 2013, 19 pages, www.ieee802.0rg/3/400GSG/publiv/13_09/holden_400_01_0913.pdf.
Holden, B., "An exploration of the technical feasibility of the major technology options for 400GE backplanes", IEEE 802.3 400GE Study Group, Jul. 16, 2013, 18 pages, http://ieee802.org/3/400GSG/public/13_07/holden_400_01_0713.pdf.
Holden, B., "Using Ensemble NRZ Coding for 400GE Electrical Interfaces", IEEE 802.3 400GE Study Group, May 17, 2013, 24 pages, http://www.ieee802.org/3/400GSG/public/13_05/holden_400_01_0513.pdf.
Linten, D. et al, "T-Diodes—A Novel Plus-and-Play Wideband RF Circuit ESD Protection Methodology" EOS/ESD Symposium 07, pp. 242-249.
Reza Navid et al, "A 40 Gb/s Serial Link Transceiver in 28 nm CMOS Technology", IEEE Journal of Solid-State Circuits, vol. 50, No. 4. Apr. 2015, pp. 814-827.
Hyosup Won et al, "A 28-Gb/s Receiver With Self-contained Adaptive Equalization and Sampling Point Control Using Stochastic Sigma-Tracking Eye-Opening Monitor", IEEE Transactions on Circuits and Systems—I: Regular Papers, vol. 64, No. 3, Mar. 2017. pp. 664-674.
Giovaneli, et al., "Space-frequency coded OFDM system for multi-wire power line communications", Power Line Communications and Its Applications, 20015 International Symposium on Vancouver, BC, Canada, Apr. 6-8, 2005, Piscataway, NJ, pp. 191-195.

* cited by examiner

|   | 1 | 2 | 3 |
|---|---|---|---|
|   | 1 | 0 | -1 |
|   | -1 | 0 | 1 |
|   | 1 | -1 | 0 |
|   | -1 | 1 | 0 |

|   | 1 | 2 | 3 | 4 |
|---|---|---|---|---|
|   | 1 | -1 | 0 | 0 |
|   | -1 | 1 | 0 | 0 |
|   | 1 | 0 | -1 | 0 |
|   | -1 | 0 | 1 | 0 |
|   | 0 | 1 | 0 | -1 |
|   | 0 | -1 | 0 | 1 |
|   | 0 | 0 | 1 | -1 |
|   | 0 | 0 | -1 | 1 |

|   | 1 | 2 | 3 | 4 |
|---|---|---|---|---|
|   | -3 | 1 | -1 | 3 |
|   | -3 | 1 | 3 | -1 |
|   | -3 | 3 | -1 | 1 |
|   | -3 | 3 | 1 | -1 |
|   | -1 | 3 | -3 | 1 |
|   | -1 | 3 | 1 | -3 |
|   | 1 | 3 | -1 | 3 |
|   | 1 | -3 | 3 | -1 |
|   | 3 | -3 | -1 | 1 |
|   | 3 | -3 | 1 | -1 |
|   | 3 | -1 | -3 | 1 |
|   | 3 | -1 | 1 | -3 |
|   | -3 | -1 | 1 | 3 |
|   | -3 | -1 | 3 | 1 |
|   | -1 | 1 | -3 | 3 |
|   | -1 | 1 | 3 | -3 |
|   | 1 | 3 | -3 | -1 |
|   | 1 | 3 | -1 | -3 |

|   | 1 | 2 | 3 | 4 | 5 | 6 |   | 1 | 2 | 3 | 4 | 5 | 6 |
|---|---|---|---|---|---|---|---|---|---|---|---|---|---|
|   | 1 | 1 | -1 | 0 | 0 | -1 |   | -1 | 1 | 0 | -1 | 1 | 0 |
|   | 1 | 1 | -1 | -1 | 0 | 0 |   | -1 | 1 | -1 | 1 | 0 | 0 |
|   | 1 | 0 | 0 | 1 | -1 | -1 |   | -1 | 1 | -1 | 0 | 0 | 1 |
|   | 1 | 0 | 0 | -1 | 1 | -1 |   | -1 | 0 | 0 | 1 | 1 | -1 |
|   | 1 | 0 | 0 | -1 | -1 | 1 |   | -1 | 0 | 0 | 1 | -1 | 1 |
|   | 1 | -1 | 1 | 0 | 0 | -1 |   | -1 | 0 | 0 | -1 | 1 | 1 |
|   | 1 | -1 | 1 | -1 | 0 | 0 |   | -1 | -1 | 1 | 1 | 0 | 0 |
|   | 1 | -1 | 0 | 1 | -1 | 0 |   | -1 | -1 | 1 | 0 | 0 | 1 |
|   | 1 | -1 | 0 | 0 | -1 | 1 |   | 1 | 1 | 0 | 0 | -1 | -1 |
|   | 1 | -1 | -1 | 1 | 0 | 0 |   | 1 | 1 | 0 | -1 | -1 | 0 |
|   | 1 | -1 | -1 | 0 | 0 | 1 |   | 1 | -1 | 0 | 0 | 1 | -1 |
|   | 0 | 1 | -1 | 0 | 1 | -1 |   | 1 | -1 | 0 | -1 | 1 | 0 |
|   | 0 | 1 | -1 | -1 | 1 | 0 |   | 0 | 1 | 1 | 0 | -1 | -1 |
|   | 0 | 0 | 1 | 1 | -1 | -1 |   | 0 | 1 | 1 | -1 | -1 | 0 |
|   | 0 | 0 | 1 | -1 | 1 | -1 |   | 0 | 1 | -1 | 1 | -1 | 0 |
|   | 0 | 0 | 1 | -1 | -1 | 1 |   | 0 | 1 | -1 | 0 | -1 | 1 |
|   | 0 | 0 | -1 | 1 | 1 | -1 |   | 0 | -1 | 1 | 0 | 1 | -1 |
|   | 0 | 0 | -1 | 1 | -1 | 1 |   | 0 | -1 | 1 | -1 | 1 | 0 |
|   | 0 | 0 | -1 | -1 | 1 | 1 |   | 0 | -1 | -1 | 1 | 1 | 0 |
|   | 0 | -1 | 1 | 1 | -1 | 0 |   | 0 | -1 | -1 | 0 | 1 | 1 |
|   | 0 | -1 | 1 | 0 | -1 | 1 |   | -1 | 1 | 0 | 1 | -1 | 0 |
|   | -1 | 1 | 1 | 0 | 0 | -1 |   | -1 | 1 | 0 | 0 | -1 | 1 |
|   | -1 | 1 | 1 | -1 | 0 | 0 |   | -1 | -1 | 0 | 1 | 1 | 0 |
|   | -1 | 1 | 0 | 0 | 1 | -1 |   | -1 | -1 | 0 | 0 | 1 | 1 |

VECTOR SIGNALING WITH REDUCED RECEIVER COMPLEXITY

CROSS REFERENCES

This application is a continuation of U.S. application Ser. No. 15/340,415, filed Nov. 1, 2016, which is a continuation of U.S. application Ser. No. 15/006,736, filed Jan. 26, 2016, which is a continuation of U.S. application Ser. No. 14/313, 966, filed Jun. 24, 2014, which claims priority to U.S. provisional application No. 61/839,360 filed on Jun. 25, 2013, all of which are incorporated herein by reference in their entirety.

The following references are herein incorporated by reference in their entirety for all purposes:

U.S. Patent Publication 2011/0268,225 of application Ser. No. 12/784,414, filed May 20, 2010, naming Harm Cronie and Amin Shokrollahi, entitled "Orthogonal Differential Vector Signaling" (hereinafter "Cronie I")

U.S. Patent Publication 2011/0302478 of application Ser. No. 12/982,777, filed Dec. 30, 2010, naming Harm Cronie and Amin Shokrollahi, entitled "Power and Pin Efficient Chip-to-Chip Communications with Common-Mode Resilience and SSO Resilience" (hereinafter "Cronie II".)

U.S. patent application Ser. No. 13/030,027, filed Feb. 17, 2011, naming Harm Cronie, Amin Shokrollahi and Armin Tajalli entitled "Methods and Systems for Noise Resilient, Pin-Efficient and Low Power Communications with Sparse Signaling Codes" (hereafter called "Cronie III".)

U.S. patent application Ser. No. 13/542,599, filed Jul. 5, 2012, naming Armin Tajalli, Harm Cronie, and Amin Shokrollahi entitled "Methods and Circuits for Efficient Processing and Detection of Balanced Codes" (hereafter called "Tajalli I".)

U.S. patent application Ser. No. 13/603,107, filed Sep. 4, 2012, naming Brian Holden and Amin Shokrollahi entitled "Selection of Unions of Vector Signaling Codes for Pin-Efficient Communications" (hereafter called "Holden I".)

The following additional references have been cited in this application: U.S. Pat. No. 8,159,375, filed Sep. 30, 2008 and issued Apr. 17, 2012, naming Aliazam Abbasfar and entitled "Simplified receiver for use in multi-wire communications" (hereafter called "Abbasfar I".)

U.S. Pat. No. 6,005,895, filed Dec. 20, 1996 and issued Dec. 21, 1999, naming Donald V. Perino and John B Dillon and entitled "Apparatus and method for multilevel signaling" (hereinafter called "Perino I".)

U.S. Pat. No. 6,359,931, filed Oct. 15, 1999 and issued Mar. 19, 2002, naming Donald V. Perino and John B Dillon and entitled "Apparatus and method for multilevel signaling" (hereinafter called "Perino II".)

U.S. Pat. No. 6,556,628, filed Apr. 29, 1999 and issued Apr. 29, 2003, naming John W Poulton, Stephen G Tell, and Robert E Palmer and entitled "Methods and Systems for Transmitting and Receiving differential signals over a plurality of conductors" (hereinafter called "Poulton I".)

U.S. Pat. No. 3,196,351, filed Jun. 26, 1962 and issued Jul. 20, 1965, naming David Slepian and entitled "Permutation Code Signaling" (hereinafter called "Slepian I".)

U.S. Pat. No. 6,452,420, filed May 24, 2001 and issued Sep. 17, 2002, naming Hee Wong and entitled "Multi-dimensional differential signaling" (hereinafter called "Wong I".)

FIELD OF THE INVENTION

The present invention relates to communications in general and in particular to transmission of signals capable of conveying information.

BACKGROUND

Communication of information as signals encoded on groups of wires is known, with larger groups allowing use of a larger code space and thus permitting more efficient communication of information. However, the number of differential comparators required to receive such group-encoded signals grows on the order of $n^2$, where n is the size of the group, severely impacting the complexity and power consumption of practical embodiments having more than a few inputs.

BRIEF DESCRIPTION OF THE DRAWINGS

Various embodiments in accordance with the present disclosure will be described with reference to the drawings. Same numbers are used throughout the disclosure and figures to reference like components and features.

FIGS. 9A, 9B, and 9C illustrate examples of different codes obtained through the optimization method of FIG. 5 in accordance with the invention.

FIG. 10 shows a code on six wires with 48 code words, obtained in accordance with the invention.

FIG. 14 shows a code of 32 code words decodable by the set of comparators of FIG. 3, in accordance with at least one embodiment of the invention.

DETAILED DESCRIPTION

Figure 1:
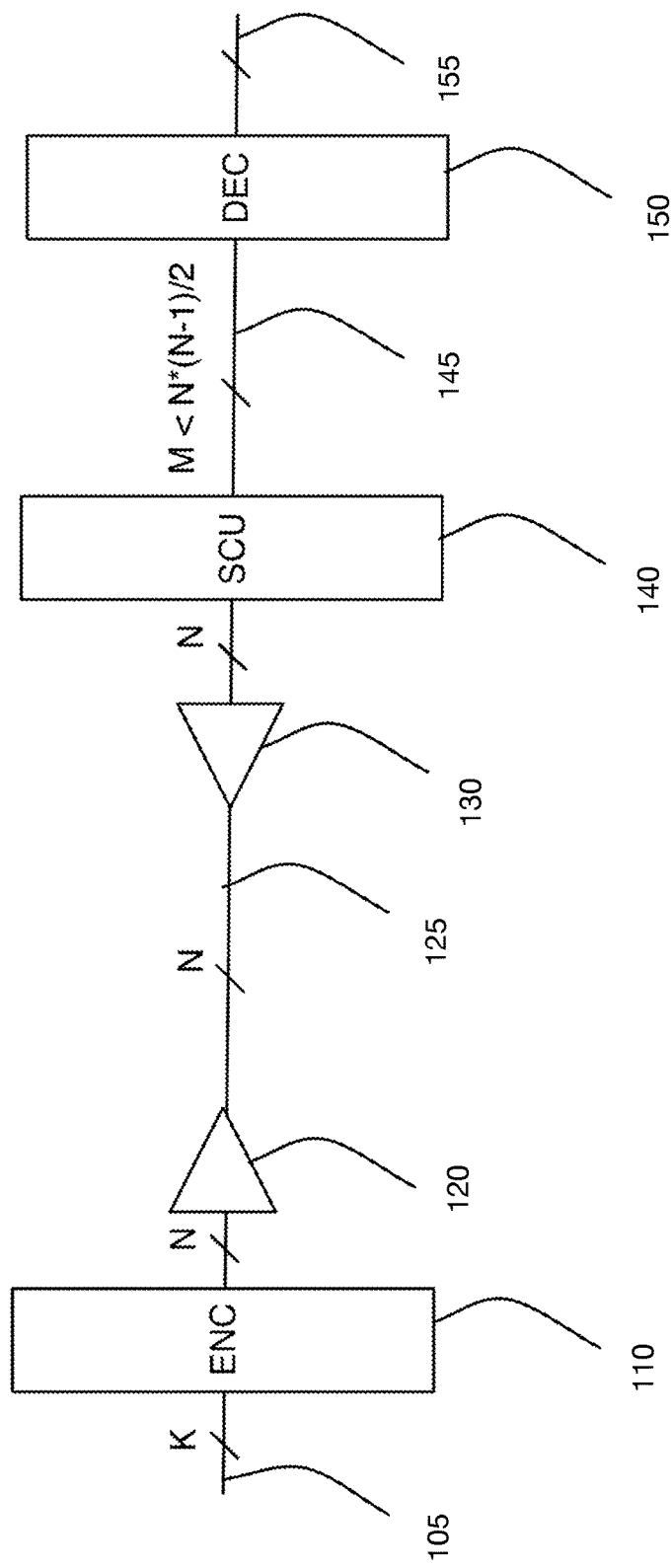
FIG. 1 is a block diagram of an embodiment in accordance with the invention.

FIG. 1 is a schematic of an exemplary embodiment of a signaling system according to this disclosure. The system receives an input word 105 consisting of K bits through an external interface. These bits are transformed by an encoder 110 into N values, the values collectively forming a code word in a vector signaling code of length N. Driver 120 outputs these values on the multi-conductor transmission line 125 consisting of N conductors, wherein the first output value of encoder 110 is output on the first wire, and the N-th output value is output on the N-th wire. A receiver front-end 130 samples the analog values on the wires, and forwards them to Sparse Comparator Unit (SCU) 140. Receiver front-end 130 may perform additional tasks, such as equalization of the received values through various means, for example using a Continuous Linear Time Equalizer (CTLE), or a Decision Feedback Equalizer (DFE), or other equalization means. If equalization is used, then equalized values are forwarded to the SCU. In other embodiments, equalization may be performed within the SCU, or directly after the SCU.

The task of SCU 140 is to compare values of the wires against one-another and output M values, each value being a 1 or a −1 (or belonging to any other set with two elements, for example 0 and 1), to a decoding unit 150. These M values 145 correspond to the results of M comparison operations performed by the SCU. Generally, $M<N*(N-1)/2$, as the number of comparators is "sparse" for any but trivially small numbers of inputs N to SCU 140. Decoder 150 creates output word 155 consisting of K bits using well-known methods such as a look-up table or Boolean logic. Some embodiments allow output word 155 to be obtained directly from the M values 145, eliminating the processing latency and complexity of a separate decoder 150. Unless there is an uncorrectable error in the signaling system, data word 155 is an exact copy of input word 105.

Figure 2:
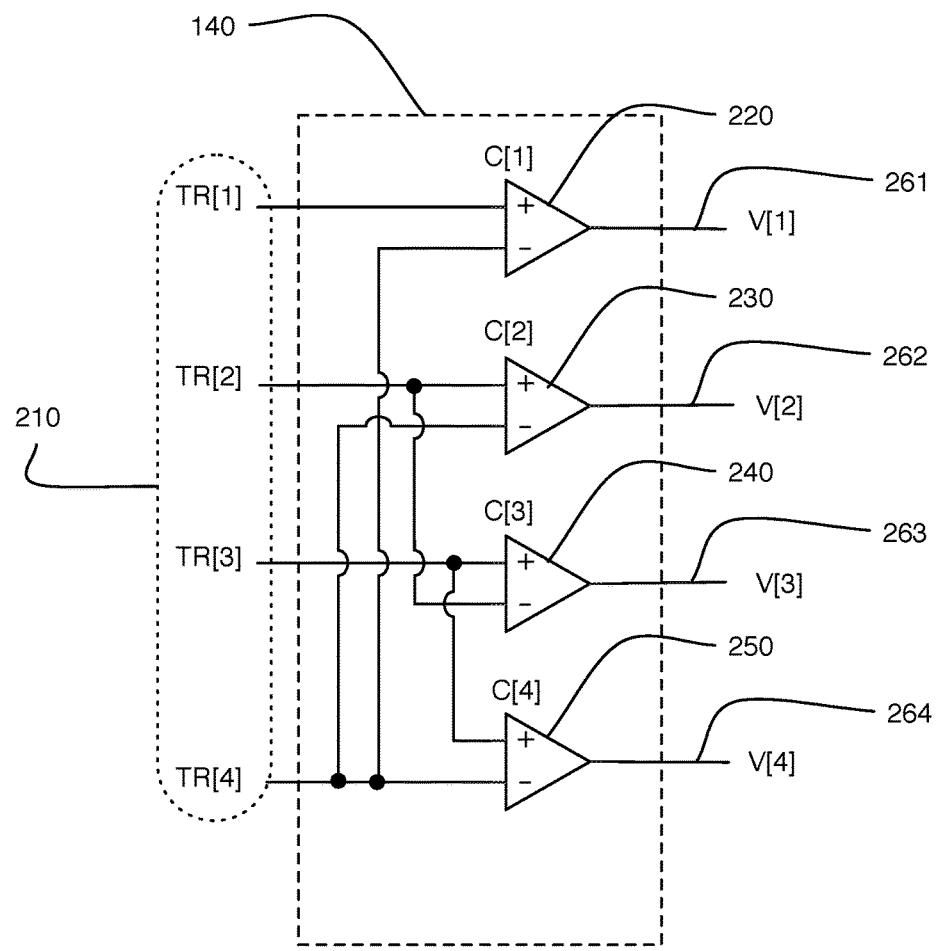
FIG. 2 is a schematic of a Sparse Comparator unit or SCU in accordance with at least one embodiment of the invention.

The operation of SCU 140 is further exemplified in FIG. 2, representing another embodiment in accordance with the invention. In this example, the number N of transmission lines is 4, and the number M of values output by the SCU is also 4, which is less than $4*(4-1)/2=6$. The SCU comprises 4 comparators 220, 230, 240, and 250, called C[1] through C[4]. It receives values TR[1], ..., TR[4] as shown at 210 from the receiver front-end (as 130 of FIG. 1.) Comparator C[1] in 220 outputs the sign of TR[1]−TR[4] as 261; comparator C[2] outputs the sign of TR[2]−TR[4] as 262; comparator C[3] outputs the sign of TR[3]−TR[2] as 263; and comparator C[4] outputs the sign of TR[3]−TR[4] as 264.

Figure 3:
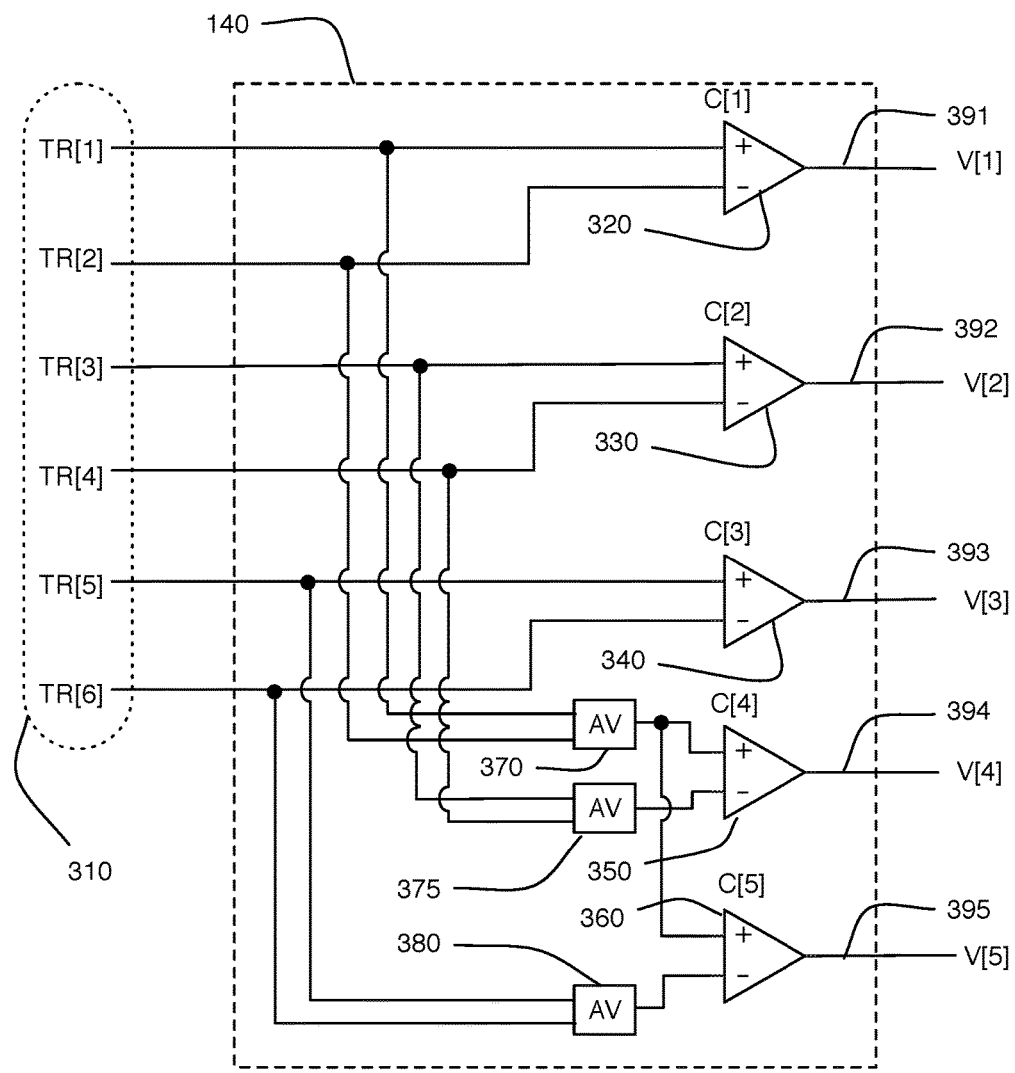
FIG. 3 is a schematic of another SCU in accordance with at least one embodiment of the invention.

A further embodiment showing the operation of SCU 140 in accordance with the invention is exemplified in FIG. 3. In this example, the number N of transmission lines is 6, and the number M of values output by the SCU is 5, which is less than $6*(6-1)/2=15$. The SCI comprises 5 comparators 350, 355, 360, 365, and 370, called C[1] through C[5]. It receives values TR[1] ... TR[6] as shown at 310 from receiver front-end (as 130 of FIG. 1.) Comparator C[1] in 3200 outputs the sign of TR[1]−TR[2] as 391; comparator C[2] in 330 outputs the sign of TR[3]−TR[4] as 392, and comparator C[3] in 340 outputs the sign of TR[5]−TR[6] as 393. SCU 140 further comprises three averaging units 370, 375, and 380. The task of these averaging units is to compute the average value of their inputs, or as an alternative embodiment, their sum. Hence, averaging unit 370 computes (TR[1]+TR[2])/2, averaging unit 375 computes (TR[3]+TR[4])/2, etc. The outputs of these averaging units are forwarded to comparators 350 and 360. In effect, comparator 350 computes the sign of (TR[1]+TR[2]−TR[3]−TR[4]) at 394 and comparator 360 computes the sign of (TR[1]+TR[2]−TR[5]−TR[6]) at 395.

Whether or not the comparator results of the SCU are sufficient to recover the transmitted values on the multiconductor transmission line 125 of FIG. 1, or equivalently, whether these comparison values provide enough information to uniquely recover the code word of the vector signaling code transmitted on these conductors, depends crucially both on the code and on the particular set of comparators. Where for example permutation modulation codes, as defined in Slepian I, are used, exactly $N*(N-1)/2$ comparators are necessary and sufficient to recover the code word. To reduce the number of comparators for permutation modulation codes, particularly such codes where N is large, this application discloses a method in which a carefully designed subset of maximum size of a given permutation modulation code is chosen according to how many comparators can be used in the SCU.

One way to choose a vector signaling code on N wires with fewer than $N*(N-1)/2$ comparators is by combining two vector signaling codes, each on fewer than N wires. For example, by combining a permutation modulation code with 12 code words obtained as all distinct permutations of (1,0,0,−1) with itself, it is possible to obtain a subset of a permutation modulation code on 8 wires with $12*12=144$ code words. The code has therefore pin-efficiency at least 7/8, since we are capable of transmitting 7 bits on the 8 wires. The code words of this code have the property that the first 4 coordinates and the next 4 coordinates each independently belong to the permutation modulation code generated by (−1,0,0,1). These code words form a subset of the permutation modulation code obtained from all 420 distinct permutations of the vector (−1,−1,0,0,0,0,1,1). The number of comparators needed for this code is 12: one set of 6 comparators for the first 4 wires, and one set of 6 comparators for the second set of wires, which is substantially less than the 28 comparators needed for the code generated by (−1,−1,0,0,0,0,1,1). On the other hand, the pin-efficiency of this code is merely 7/8, which is less than the pin-efficiency 1.5 of the larger code. Another example is provided by the code obtained from all 24 permutations of (−1,−1/3,1/3,1). This code also requires 6 comparisons of the 4 wire values; combining the code with itself leads to a code with $24*24=576$ code words. This code would be capable of sending 9 bits on 8 wires with 12 comparators. However, in some applications one may want to send only 8 bits on 8 wires, and would like to reduce the number of comparators. Simple combining of permutation modulation codes does not work then, and a new procedure is needed, which is herein described. Yet another application is the code obtained from all 6 distinct permutations of (−1,0,1). Combining this code with itself, it is possible to obtain a code with 36 code words requiring 6 comparators. It is possible to send slightly more than 5 bits over 6 wires with this code. However, in some applications it could be much more important to reduce the number of comparators to 5, even if the number of code words is reduced to 32 instead of 36. As will be seen later, one of the procedures outlined below creates a code with 32 elements for which the 5 comparators in the SCU of FIG. 3 are sufficient to decode the code words.

Other constraints beyond total number of comparators may influence the design of practical embodiments of the invention. As examples and without implication of limitation, it may be desirable to minimize complexity of decoder 150 or eliminate it entirely by allowing some number of SCU results M to be mapped directly to some number of output bits K, eliminate ambiguous comparator outputs by insuring that all codes in the selected subset present distinctly different values to each comparator input, and/or reduce complexity of encoder 110 by judicious selection of how inputs 105 map to the N values of the transmitted code word. As will be readily apparent to one familiar with the art, these and other secondary design characteristics are affected by the size and composition of the set of code words used, as well as by the composition of the SCU that detects them.

Design of Codes and SCU's using Graph Optimization

A procedure is now described which can be used to design sub-codes of a given code, and SCU's with a given number of comparators such that the SCU's contain sufficient information to uniquely determine the code words. A comparator comparing two values a and b will as an example output +1 or −1, depending on whether a−b is positive or negative. If a and b are values on two wires corresponding to code words coordinate values c and d, respectively, that have been subjected to channel noise, and if c and d are distinct, then it can be assumed that the result of the comparator on values a and b is the same as the result of the comparison of c and d. In other words, sign(a−b)=sign(c−d). If the noise on the communication channel is too large for this equality to hold, then noise mitigation techniques, such as equalization, or crosstalk cancellation, or other techniques have to be applied to the values on the multiconductor transmission line such as 125 of FIG. 1 before the wire values are compared against one another.

If the values c and d in the code word are the same, then the output of the comparator is inherently unreliable, because depending on random noise on the channel (which is very hard to avoid), the value a can be slightly larger or smaller than b. Therefore, a given comparator comparing wires k and m can distinguish two transmitted code words (c[1], . . . , c[N]) and (x[1], . . . , x[N]) if sign(c[k]−c[m])*sign(x[k]−x[m])<0, that is, the quantities c[k]−c[m] and x[k]−x[m] are nonzero and of opposite signs. A set of comparators C[1], . . . , C[M] is therefore sufficient for decoding a code if every two distinct code words are distinguishable by at least one of these comparators. In such a situation the code is called "decodable" by the set of comparators. The procedure described below determines a subcode of largest size that is decodable by the given set of comparators, for a given set of comparators and a given code called the "large code".

The procedure uses the mathematical concept of a finite graph, as explained in several textbooks known to those of skill in the art. In the present graph, the nodes are the elements of the large code. There is an edge between two such nodes if the corresponding code words of the large code are not distinguishable by the set of comparators C[1], . . . , C[m]. A "maximum independent set" (hereinafter called MIS) in this graph is a subset of the nodes of largest size such that there is no edge between any two nodes in this set. A MIS therefore determines a largest subcode of the large code that is decodable by the given set of comparators.

Figure 4:
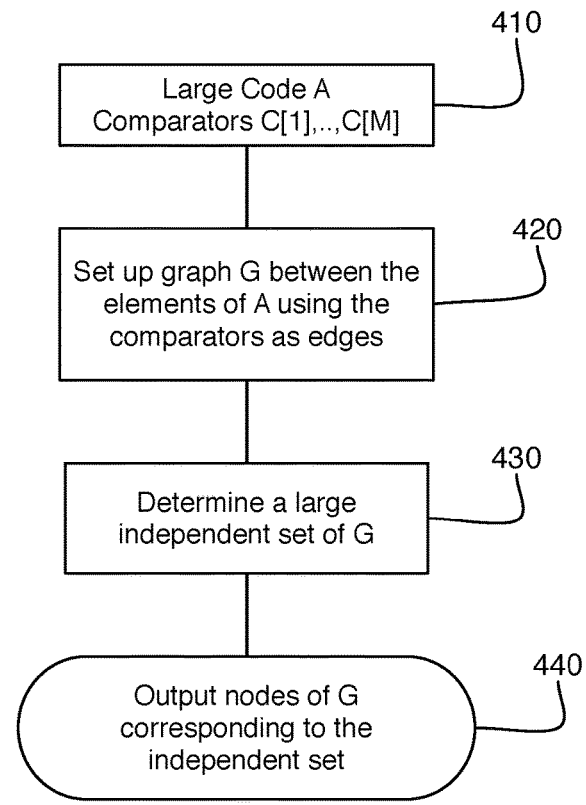
FIG. 4 is a flow chart illustrating the procedure for graph optimization in accordance with the invention.

The procedure is outlined in FIG. 4. After setting up the graph described above, a large independent set is computed in Step 430. Whether this set is a maximum independent set depends on the computational resources available to the process in FIG. 4. As is known to those of skill in the art, finding a maximum independent set is a hard computational problem for large instances of the graph. However, heuristic algorithms exist that output a large independent set, as known to those of skill in the art, and these may be preferred in some embodiments.

In applications, it may not be a-priori clear which set of comparators gives rise to the largest set decodable by any set of comparators with a given size. The procedure in FIG. 5 alleviates this problem by generating all sets T of M comparators, applying the procedure in FIG. 4 to all members of this set T, recording the size of the resulting output, and keeping it if it has the largest size seen so far in Step 550. The final output of this procedure in Step 560 is a code of maximum size that is decodable by M comparators.

In some cases the output of the procedure in FIG. 4 may be a code that is obtained by combining two smaller permutation modulation codes, each on a smaller set of wires. For example, suppose that the large code A consists of all 30 distinct permutations of the vector (+1,+1,0,−1,−1), and that the number M is 4. A possible output of the procedure in FIG. 5 could be the following set consisting of 12 elements, and the comparators 1:3, 2:5, 4:3, 1:4, wherein a:b means a comparator comparing the values of wires a and b:

| Wire 1 | Wire 2 | Wire 3 | Wire 4 | Wire 5 |
| --- | --- | --- | --- | --- |
| 1 | 1 | 0 | −1 | −1 |
| 1 | −1 | 0 | −1 | 1 |
| 1 | 1 | −1 | 0 | −1 |
| 1 | −1 | −1 | 0 | 1 |
| 0 | 1 | 1 | −1 | −1 |
| 0 | −1 | 1 | −1 | 1 |
| 0 | 1 | −1 | 1 | −1 |
| 0 | −1 | −1 | 1 | 1 |
| −1 | 1 | 1 | 0 | −1 |
| −1 | −1 | 0 | 1 | 1 |
| −1 | 1 | 0 | 1 | −1 |
| −1 | −1 | 0 | 1 | 1 |

Though it may not be immediately apparent at first observation, this code is a combination of the code obtained from all 6 permutations of (1,0,−1) on wires 1, 3, 4, and the code consisting of the code words (+1,−1) and (−1,+1) on wires 1 and 5.

This is easily seen by setting up a second form of graph, called a "comparator graph" in the following descriptions, and checking whether this graph is connected. Herein, the comparator graph is a graph in which the nodes are the indices of the wires, and there is an edge between nodes a and b if and only if a:b is one of the comparators. The comparator graph of the example above is given in FIG. 6. As can be seen, this graph is not connected, which means that there are two nodes in the graph (for example node 1 and node 2) for which there is no path between them consisting of edges of the graph. As can be easily appreciated by those of skill in the art, a set of comparators output by the procedure in FIG. 5 corresponds to the trivial case of combining codes of smaller length if and only if the corresponding comparator graph is not connected. Because of possible deficiencies associated with this type of code construction, this application is mostly concerned with the case where the comparator graph is connected and hence the code and the comparators cannot be obtained through simple concatenation of codes on smaller numbers of wires.

Figure 7:
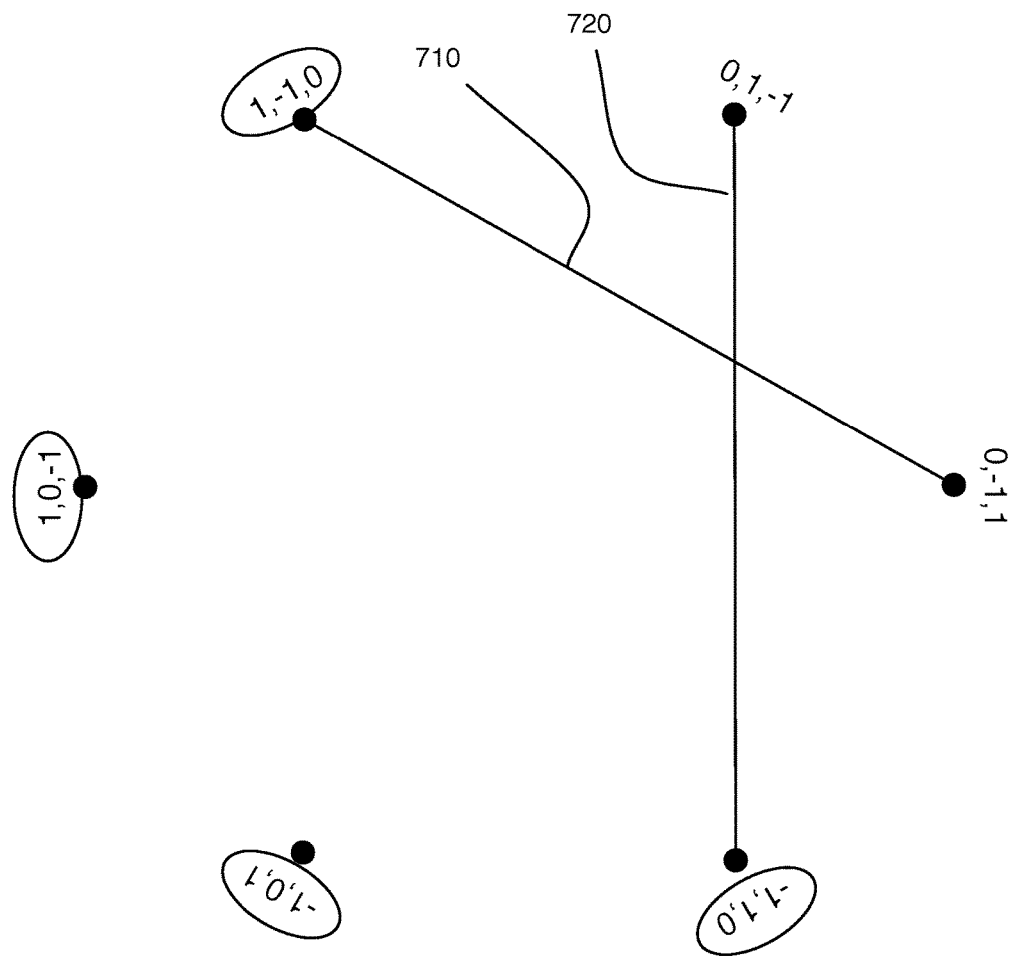
FIG. 7 is a graph illustrating the maximum independent set of a second example.

An example embodiment in accordance with the invention that applies the procedure outlined in FIG. 4 is now described with reference to the graph of FIG. 7. In this example, the large code consists of the 6 distinct permutations of the vector (1,0,−1), and the comparators are 1:2 and 2:3. The nodes in this graph are labeled by the elements of the large code, and there is an edge drawn between two nodes if and only if they are not distinguishable by the set of comparators. For example, the results of the comparators on the vector (1,−1,0) are +1,−1 and the results of the comparators on the vector (0,−1,1) are also +1,−1; thus they are shown as indistinguishable using those comparators by edge 710. The same argument may be made for the two nodes connected by edge 720. The circled code words form an independent set in this graph, and in fact, they form a maximum independent set, as can be easily seen. (That is, the two binary decisions obtained from the two comparators 1:2 and 2:3 enumerate four distinct combinations, which are severally represented by the circled code words of FIG. 7.) This gives us therefore 4 code words decodable by the set of 2 comparators 1:2, 2:3.

Figure 8:
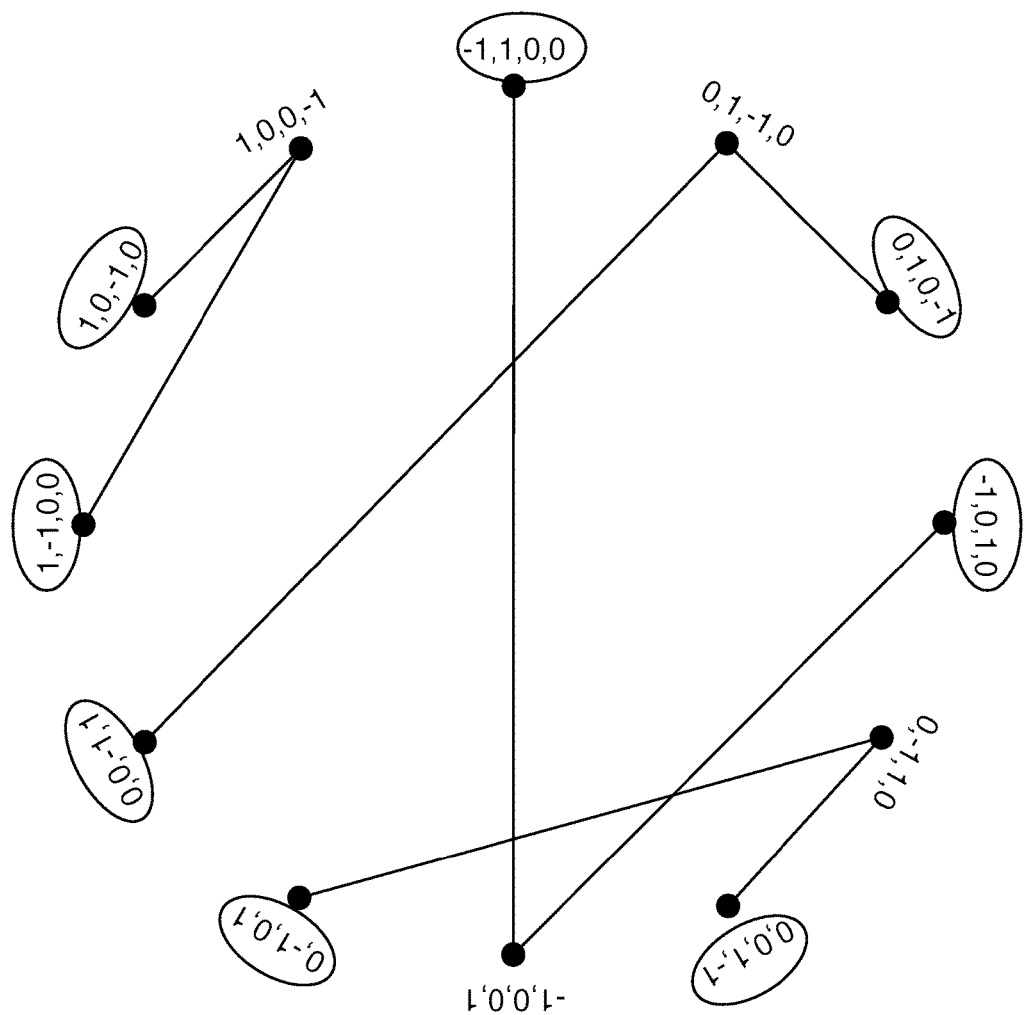
FIG. 8 is a graph illustrating the maximum independent set of a third example.

Another example embodiment in accordance with the invention is shown in the graph of FIG. 8. In this example, the large code consists of the 12 distinct permutations of the vector (1,0,0,−1), and the comparators are 1:2, 1:3, 1:4, and 2:3. Since any comparator presented with the two 0 values will produce an ambiguous result, two vectors are indistinguishable by that comparator. The circled code words form an independent set in this graph, and in fact, they form a maximum independent set, as can be easily seen. This gives us therefore 8 code words decodable by the set of 4 comparators 1:2, 1:3, 1:4, 2:3. Without the present teachings, 6 comparators would have been needed to distinguish these 8 code words.

Figure 5:
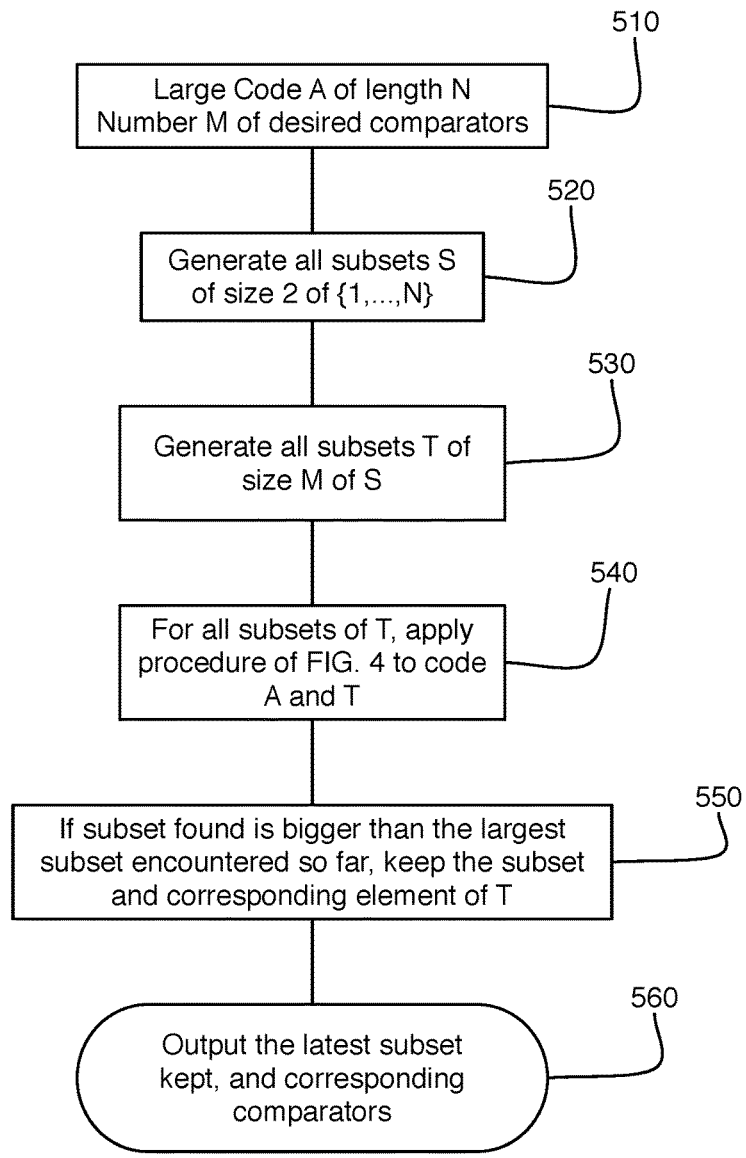
FIG. 5 is a flow chart illustrating a procedure to obtain all sets T of M comparators, in accordance with at least one embodiment of the invention.
Figure 6:
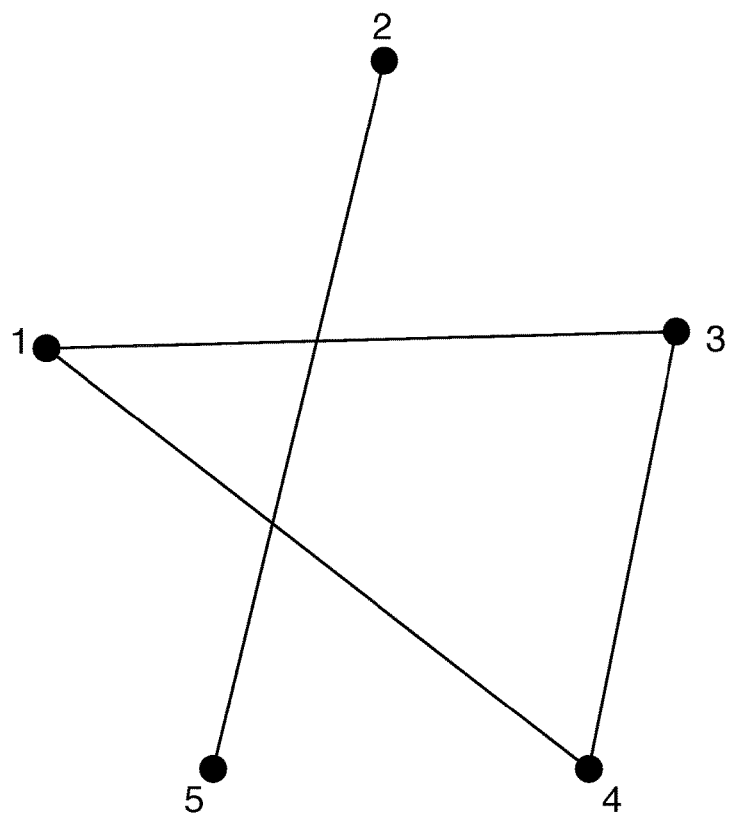
FIG. 6 is a graph illustrating the maximum independent set of one example.

FIGS. 9A, 9B, and 9C show different codes obtained through the optimization method outlined in FIG. 5 in accordance with the invention. The codes are organized in tables. The top row outside the table shows the index of the wires. The table itself shows the code words, one per row. The lower box shows the sequence of comparators used. The code in FIG. 9A corresponds to the graph in FIG. 7, and the code in FIG. 9B corresponds to the graph in FIG. 8. The code shown in the graph FIG. 9C is a quaternary code with 18 code words and 5 (instead of 6) comparators. The code words can be further normalized so their coordinates have values between any given two numbers, for example 1 and −1, or 1 and 0. This code is also interesting in that by leaving out the third and fourth code words, we would obtain a code with 16 code words capable of transmitting on average 1 bit per wire such that, under randomized transmission, all wires would take equally often the values −3, −1, 1, and 3. Such balanced codes may be preferred in certain applications over codes not exhibiting this property. In this case the number of comparators is optimal, since, as can be seen by anyone of average skill in the art, 4 comparators producing binary results would be able to decode a code with at most $16=2^4$ code words. As will be apparent to one familiar with the art, a code in which there are no duplicated values is unlikely to produce ambiguous outputs from pairwise signal comparators, and the four decoded binary results for sixteen codewords may allow decoder-less output of received data, which are desirable design characteristics.

Many other embodiments in accordance with the invention may be produced using the procedure outlined in FIG. 5. For example, FIG. 10 shows a code on 6 wires with 48 code words that is decodable by 10 comparators. This code is a subcode of the permutation modulation code obtained from all 90 distinct permutations of the vector (1,1,0,0,−1,−1). Without the present teachings, a decoder for this code would have required 15 comparators, 50% more comparators than given in this example.

In summary, it is observed that some applications are more sensitive to detection resource requirements (such as the required number of differential comparators) than to pin density. Therefore, it is desirable to apply the methods illustrated in FIG. 4 and FIG. 5 to find a subcode of the large code that may be fully detected by a selected (and smaller) number of comparators. A comparator graph may be drawn of the proposed subcode and comparator set to identify sets of codes in the large code that are indistinguishable by the selected comparator set, and thus contain codes that are redundant to the selected subcode. The design of SCU's based on the above coding schemes and selected subcode is straightforward, as can be appreciated from those of skill in the art.

Design of More General SCU's

Figure 11:
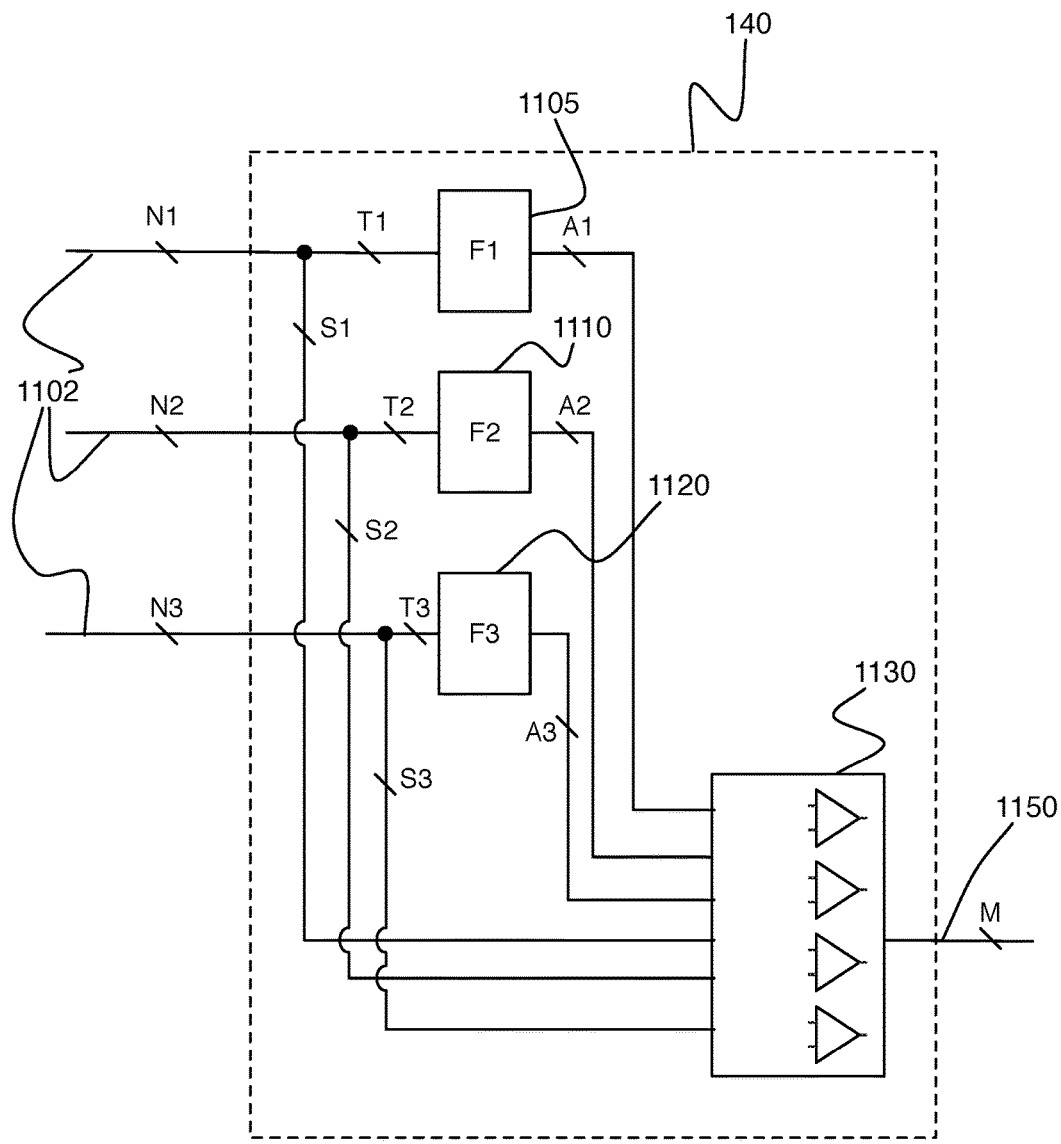
FIG. 11 is a block diagram of a generalized SCU illustrating a method of design in accordance with at least one embodiment of the invention.

A more general embodiment of the SCU 140 in accordance with the invention is now described with reference to FIG. 11. In this embodiment the N transmission lines 1102 may be divided into multiple groups of sizes N[1], N[2], . . . . For simplicity, in FIG. 11 only the case of three groups is illustrated, but in general there is no limitation on the number of groups. There are N1 wires in the first group, N2 wires in the second, and N3 wires in the third group. The SCU comprises an inner SCU unit SCU[in] 1130 and multiple arithmetic units 1105, 1110, and 1120, denoted by F1, F2, F3. These arithmetic units take as input values on some (or all) of the wires within their group, perform computations on these values, and output result values which are forwarded to the inner SCU 1130. In FIG. 11, the first group of wires contributes T1 values to F1, the second group T2 values to F2, and the third group T3 values to F3. Moreover, S1 values of the wires in the first group, S2 wire values in the second group, and S3 wire values in the third group are also forwarded to the inner SCU 1130. The sum S1+T1 can be larger than N1, meaning that some of the wire values may be needed in the corresponding arithmetic unit, and may concurrently be forwarded to the inner SCU 1130. The inner SCU 1130 consists of simple comparators.

As one example, the direct connections S1, S2, and S3 connected to inner SCU 1130 may comprise a decoding of separate codes on lines N1, N2, and N3 (producing by themselves a disconnected and thus undesirable comparator graph,) and the additional connections T1, T2, and T3 and functions F1, F2, and F3 provide to inner SCU 1130 the additional information necessary to provide graph connection and enlarge the resulting fully detected subcode.

Figure 12:
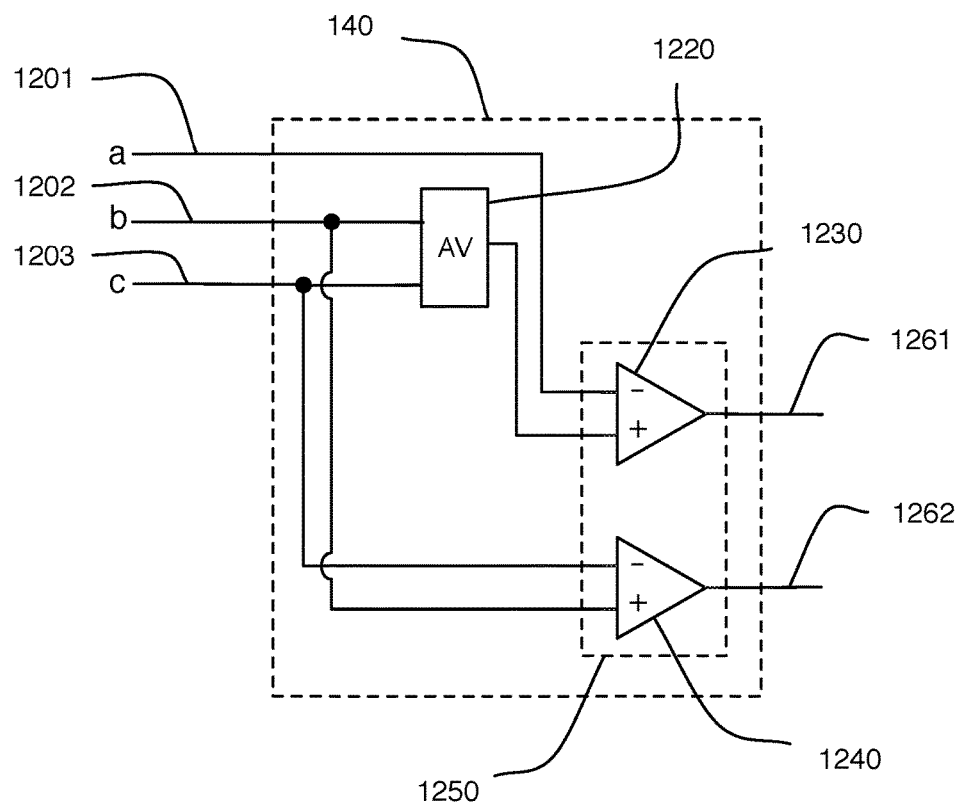
FIG. 12 is a block diagram embodying one SCU design in accordance with the invention.
Figure 13:
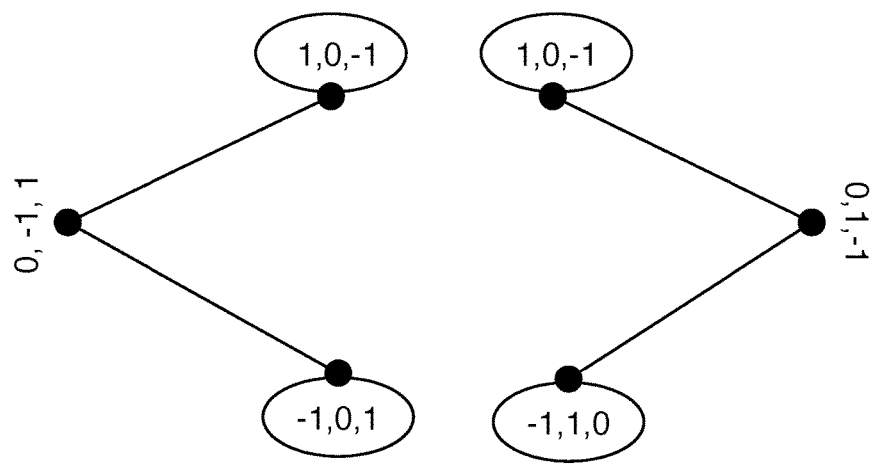
FIG. 13 is a finite graph illustrating the maximum independent set of an example.

If the comparators in the inner SCU 1130 are known in advance, and if the structure of the arithmetic units is also known in advance, then the code design problem can be accomplished using a procedure very similar to that outlined in FIG. 4. As an example embodiment in accordance with the invention, consider the case in which N1=1, N2=2, that F1 is a null operation, so the value of wire 1 is directly forwarded to the inner SCU 1130, F2 forms the average of its incoming values, T2=2, S2=2, and there are two comparators in the inner SCU 1250, one comparing the values of wires 2 and 3, and the other comparing the average of wires 2 and 3 with the value on wire 1. FIG. 12 shows a schematic of the SCU in this case: the wires a, b, c are divided into a group of one wire a, and a group of two wires b, c. The first comparator 1230 compares a against (b+c)/2 and the second comparator 1240 compares b against c. If the large code is chosen to be the code consisting of all six permutations of (1,0,−1), then the finite graph corresponding to the code words and the comparators is given in FIG. 13. The circled code words form a maximum independent set. These are four code words, which means that the code is optimal for the total number of comparators.

Figure 14:
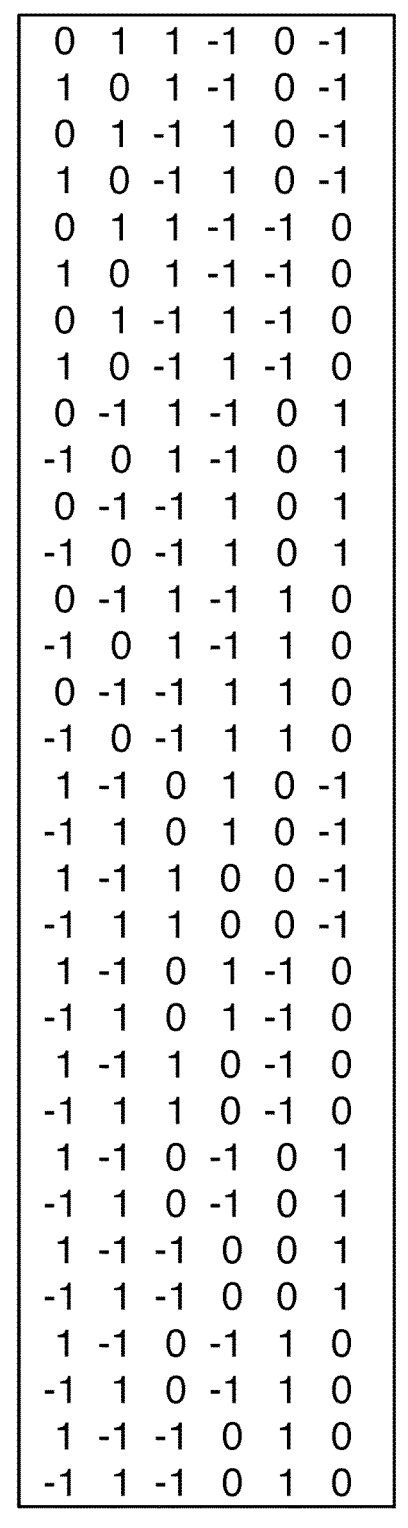

Another embodiment in accordance with the invention is the SCU in FIG. 3. Here, the incoming wires TR[1], . . . , TR[6] are subdivided into groups of 2 wires each, with TR[1], TR[2] forming the first group, TR[3], TR[4] forming the second group, and TR[5], TR[6] forming the last group. The inner SCU consists of the 5 comparators C[1], . . . , C[5]. The arithmetic units are averaging units, or alternatively, summation units. Application of the procedure in FIG. 4 to the large code given by all the 90 permutations of the vector (1,1,0,0,−1,−1) reveals a code of size 32, which is decodable by the set of comparators in FIG. 3. The code itself is given in FIG. 14. The existence of this code shows that a more general version of the SCU containing arithmetic units is genuinely stronger than the case in which such units are disallowed: it can be shown that for the large code above, and allowing only for comparators, the largest code that can be constructed which is decodable with 5 comparators has a size of only 24, so to create a code with 32 code words, the arithmetic units are needed.

Recursive Design of SCU's

When the number of wires is large, or when the large code has many code words, or when the structure of the arithmetic units 1105, 1110, and 1120 of FIG. 11 are not known in advance, the process of FIG. 5 may not be computationally efficient enough for the design of a code. Moreover, in such cases, the codes delivered by the process of FIG. 5 may be difficult to encode or to decode. A recursive procedure is now described to design larger SCU's starting from smaller SCU's, or smaller non-sparse comparator units. For purposes of description, the term SCU is herein used interchangeably for both sparse and non-sparse comparator units used as such subcomponents of larger Sparse Comparator Units.

If the processes of FIG. 4 and FIG. 5 represent "top down" analysis finding an optimal subset of a large code space, this recursive approach may be seen as a "bottom up" design method starting with small, easily decoded but otherwise unconnected regions of code space and connecting them to provide a unified and enlarged codespace.

Figure 15:
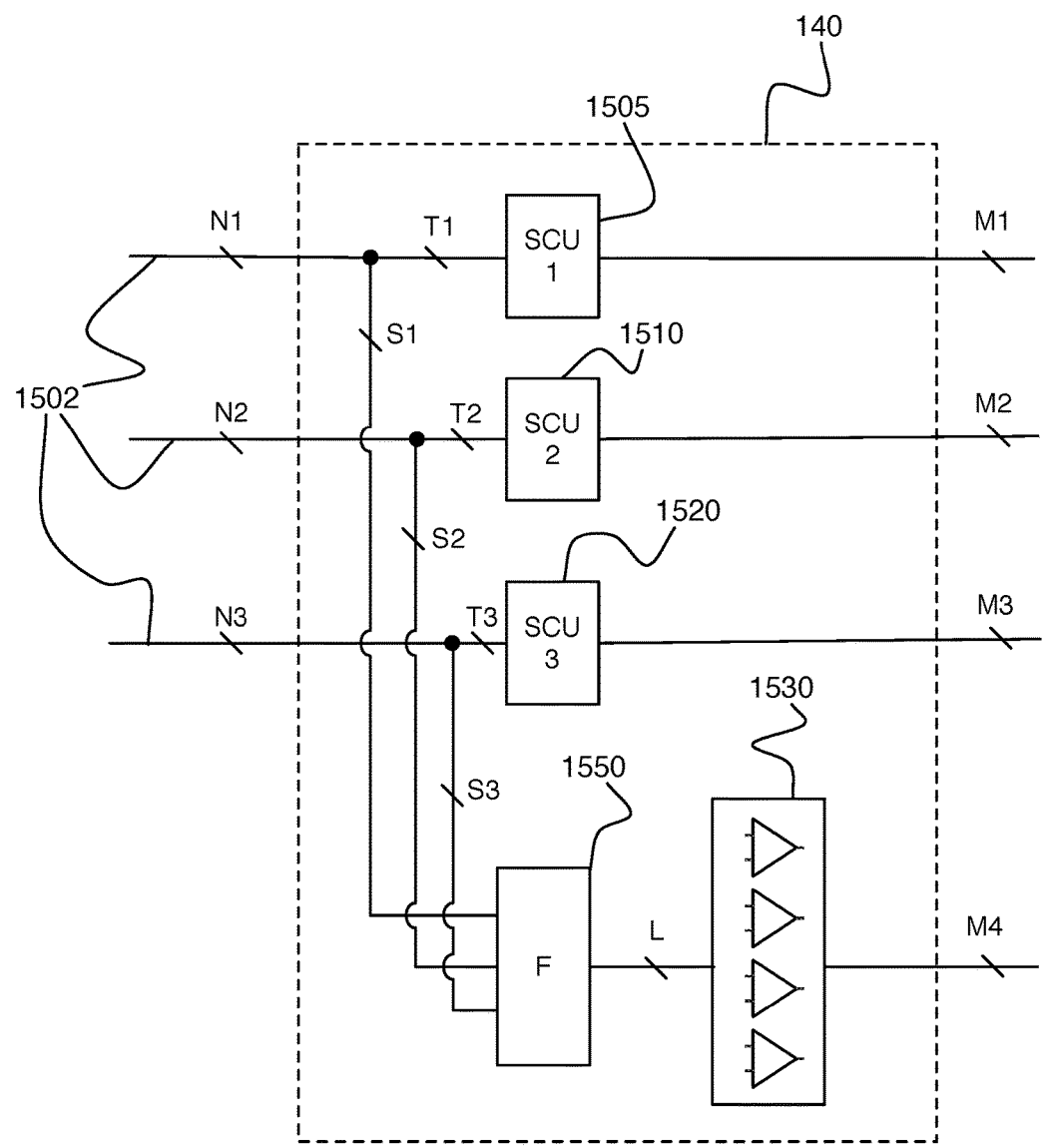
FIGS. 15 through 19 are block diagrams illustrating elements of the recursive SCU design process, in accordance with at least one embodiment of the invention.

With reference to the embodiment of FIG. 15 in accordance with the invention, the SCU 140 in this case is comprised of several local SCU's denoted SCU1 1505, SCU2 1510, and SCU3 1520, an arithmetic unit 1550, and a global comparator unit 1530. In general there can be more or fewer than 3 local SCU's; the number three has been chosen for illustrative purposes only. In this case, the incoming wires have been divided into three groups 1502 with N1, N2, and N3 wires, respectively. S1 of the first set of wires, S2 of the second set of wires, and S3 of the third set of wires enter an arithmetic unit 1550. The arithmetic unit output L values that are forwarded to the global comparator unit 1530, which in turn outputs M4 values. The global comparator unit may only comprise simple comparators, or it may again be an SCU according to FIG. 11. T1 of the wire values of the first set enter a local SCU 1505 which outputs M1 values, whereas T2 and T3 of the wire values of the second and third set enter their respective local SCU's 1510 and 1520, and output M2 and M3 values, respectively.

In operation, the local SCU's 1505, 1510, and 1520 correspond to one or more codes of length N1, N2, and N3, respectively, which are decodable by their corresponding SCU's. Without the arithmetic unit 1550 and the comparator unit 1530, these codes would be used independently on the communication wires, and thus a comparator graph of the resulting system would be unconnected. The arithmetic unit and the comparator unit have the effect of enlarging the codespace in such a way that the new codespace is decodable by a small number of comparators.

Examples of additional embodiments in accordance with the invention utilizing this recursive construction will now be given. In all these examples the overall code obtained will have a coarse and a fine structure. The coarse structure is detected via the global SCU 1530, whereas the fine structure is detected via the local SCU's 1505, 1510, and 1520. Where there are n local SCU's, the coarse structure is that of a code of length n.

One interpretation of this coarse/fine structure is that the fine structure represents local SCU detection of codewords within regions of code space that would be otherwise disconnected, and the coarse structure represents identification of the particular region by the global SCU. Combined, the coarse and fine information fully detects all codes in the combined codespace. As a trivial example, the local SCUs might represent differential comparators on two distinct wire pairs. Each differential comparator is oblivious to any common-mode signal carried by their input wires. However, a global SCU may detect such common mode differences between wire pairs, providing the additional information that allows detection of the complete input code.

In at least one embodiment in accordance with the invention, the global SCU consists of one comparator only. The corresponding code is called the "global" code hereinafter.

Figure 16:
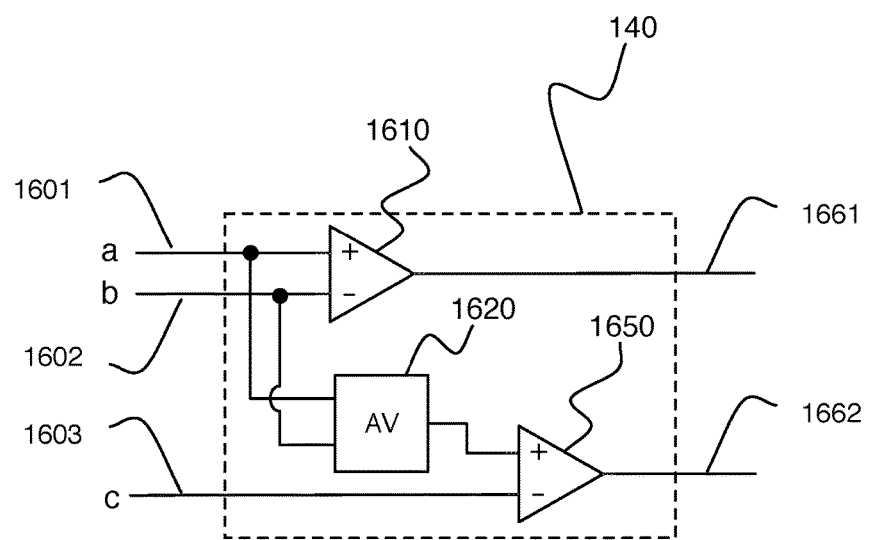

In a further embodiment of the invention, shown in FIG. 16, there is only one local SCU consisting of one comparator 1610. The corresponding coarse structure of the code is therefore that of a differential code given by the code words $(1,-1)$ and $(-1,1)$. There are three incoming wires denoted a, b, c, divided into two groups, one consisting of the wires a, b, and the other consisting of the wire c. The arithmetic unit consists of an average unit 1620 whose output is the average of its input values (or alternatively, the sum of its input values.) The global SCU consists of only one comparator 1650. The number of signals leaving the SCU 140 is 2. The code corresponding to this configuration can be described as follows: In the differential code a 1 at the first position is replaced by $(0,1)$ or by $(1,0)$, and a $-1$ at the first position is replaced by $(0,-1)$ or $(-1,0)$. The sum of the values of the first two wires is always equal to the first component of a given code word in the differential code, and the value of the last wire is equal to the value of the second component of the code word in the global code. The averaging (or summing) unit recovers the value 1 or $-1$ on the first two positions, and compares it against the value of the third wire. The outcome is a ternary vector signaling code of length 3, having 4 code words, and decodable by the optimal number 2 of comparators.

Figure 17:
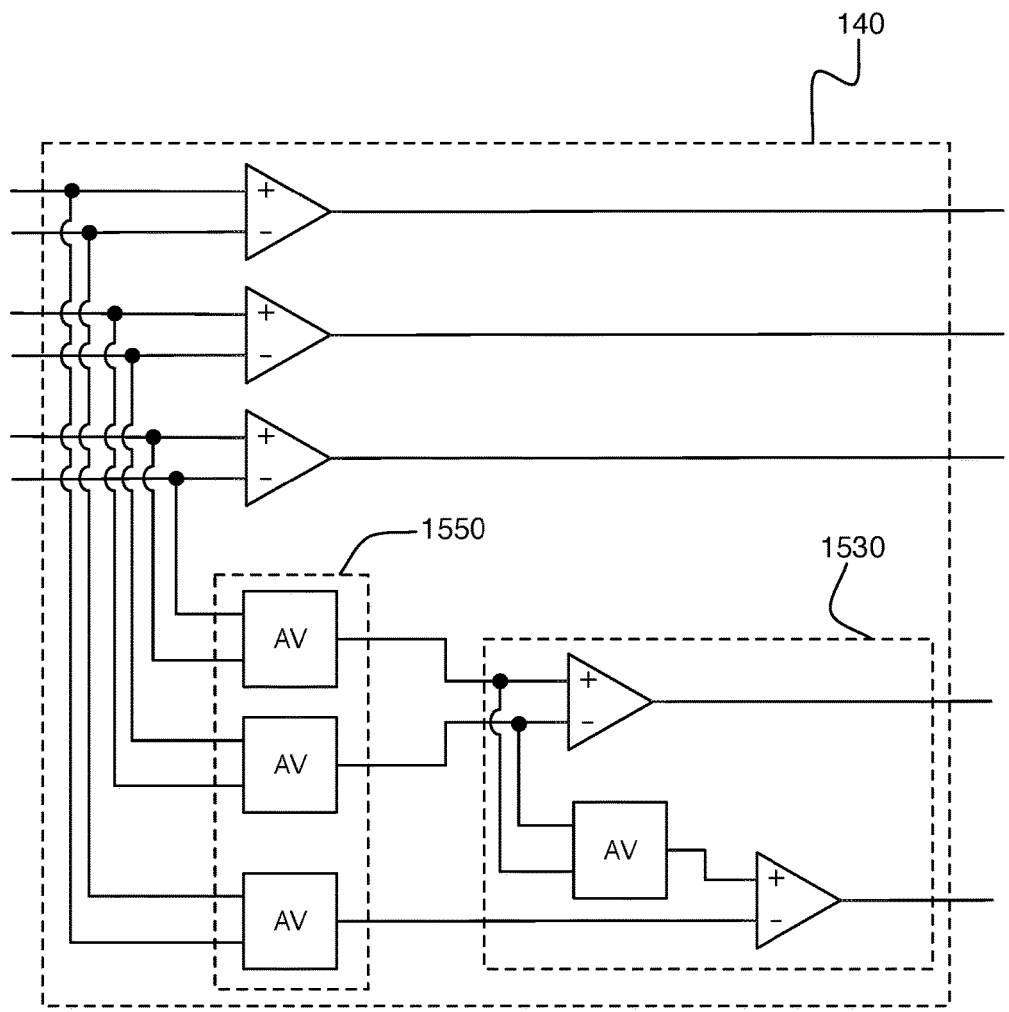

This SCU can now itself be used as the global SCU in a recursive application, representing another embodiment in accordance with the invention. In each code word of the code obtained in the previous example, a "1" is replaced by either $(1,0)$ or $(0,1)$, a "$-1$" is replaced by either $(-1,0)$ or $(0,-1)$, and a "0" is replaced by either $(1,-1)$ or $(-1,1)$. The resulting code, is of length 6, has 32 code words, and is decodable by 5 comparators, which is the optimal number of comparators for this code. Its SCU is shown in FIG. 17. As can be seen, the global SCU 1530 of this SCU is the same as the SCU in FIG. 16. The arithmetic unit 1550 consists of three averaging (or summing) units. The local SCU's consist of only one comparator, comparing values of adjacent wires.

If the SCU of this code is used as the global SCU in another recursive application, representing additional embodiments also in accordance with the invention with 1's, 0's, and $-1$'s changed according to the above scheme, another ternary code of length 12 is obtained which has $2^{11}=2048$ code words and is the decodable by the optimal number of 11 comparators. This sequence of examples can be continued in a similar manner.

Figure 18:
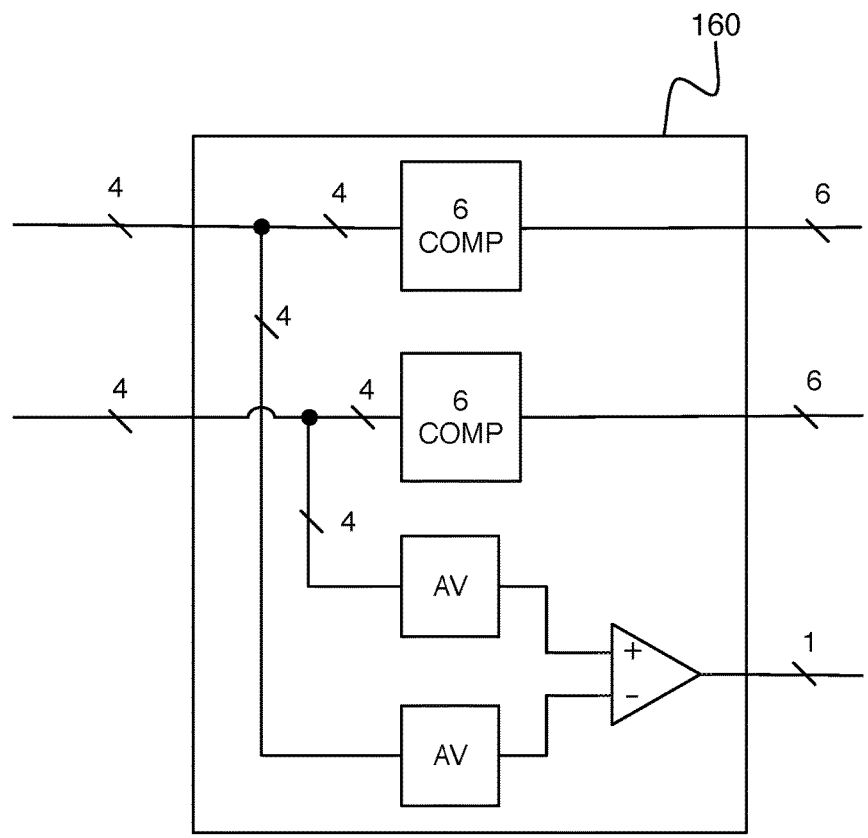

A different way of generalizing the example of FIG. 16 in accordance with the invention is to keep the global SCU to consist of one comparator only, and to change the structure of the local SCU's 1505-1520 in FIG. 15. This leads to embodiments in accordance with the invention replacing in the differential code $\{(1,-1), (-1,1)\}$, a "1" by some vector with sum equal to 1 (or some other positive number), and a "−1" by some vector with sum equal to −1 (or the negative of the first sum). As an example, suppose that the "1" is replaced by any of the 12 permutations of the vector (1,1,0,−1), whereas a "−1" is replaced by any of the 12 permutations of the vector (−1,−1,0,1). An SCU that decodes this code is given in FIG. 18. The wires are subdivided into two groups of 4 wires. The local SCU's use each 6 comparators to compare the values of the wires in each group against one another. The arithmetic unit computes the average (or alternatively, the sum) of the first and the second groups of wires, and compares them with one comparator, which makes up the global SCU. The resulting code consists of 288 code words which are permutations of the vector (1,1,1,0,0,−1,−1,−1) and which is decodable with 6+6+1=13 comparators.

Figure 19:
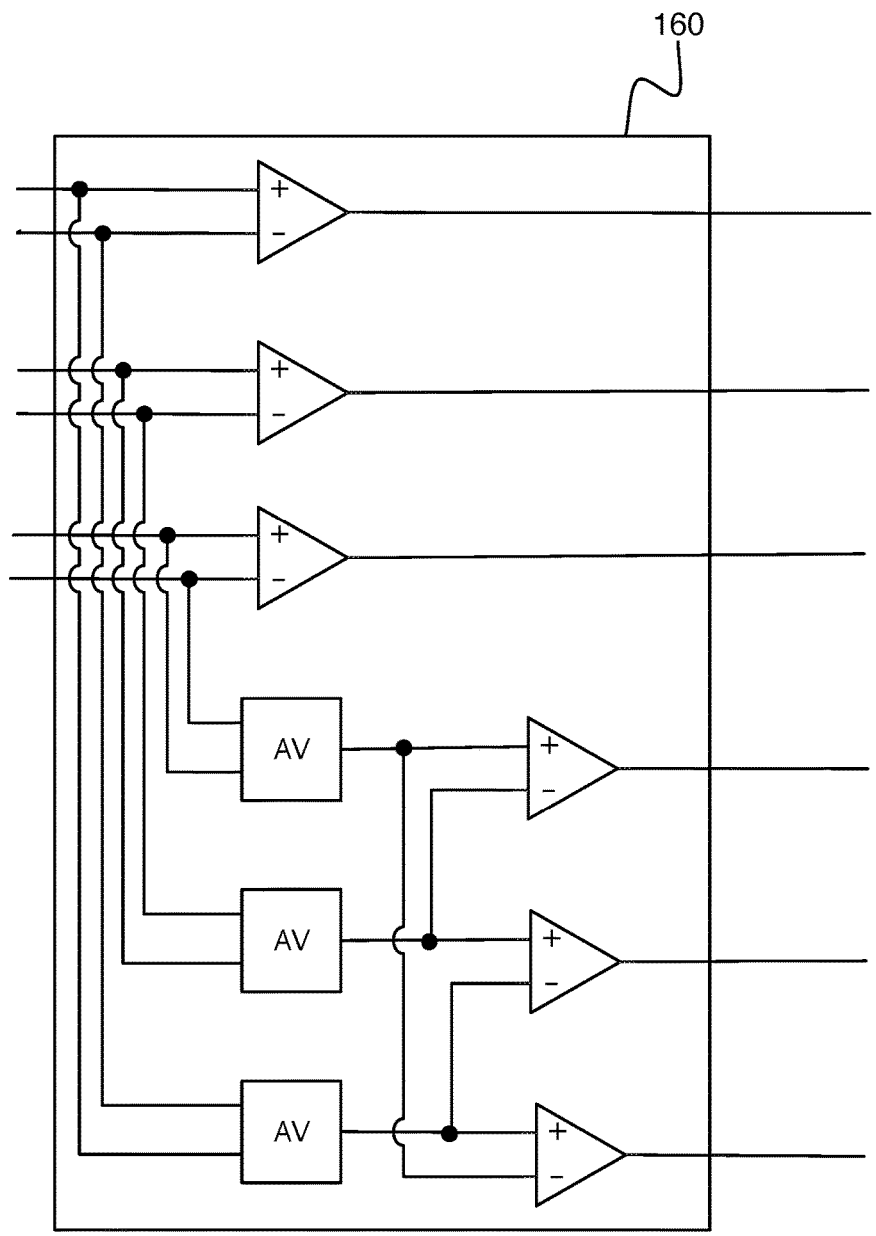

At least one embodiment in accordance with the invention replaces the global SCU with a comparator unit accepting three inputs, and computing all three comparisons of pairs of its inputs. The corresponding code for this SCU is the code consisting of all permutations of (1,0,−1). If a "1" is replaced by (0,1) or (1,0), a "−1" is replaced by (0,−1) or (−1,0), and "0" is replaced by (1,−1) or (−1,1), a ternary code of length 6 is obtained with 48 code words which is decodable by the SCU of FIG. 19 with 6 comparators. The number of comparators needed for this code is optimal. By concatenating this code with the code consisting of all 6 permutations of the vector (1,0,−1) in further embodiments in accordance with the invention, a ternary code is obtained on 9 wires capable of transmitting 48*6=288 code words and which is decodable by an SCU with the optimal number of 9 comparators.

The examples presented herein illustrate the use of vector signaling codes for point-to-point chip-to-chip interconnection. However, this should not been seen in any way as limiting the scope of the described invention. The methods disclosed in this application are equally applicable to other interconnection topologies and other communication media including optical, capacitive, inductive, and wireless communications, which may rely on any of the characteristics of the described invention, including minimization of reception or detection resources by selective modification or subset selection of code space. The methods disclosed in this application are equally applicable to embodiments where the encoded information is stored and subsequently retrieved, specifically including dynamic and static random-access memory, non-volatile memory, and flash programmable memory. Descriptive terms such as "voltage" or "signal level" should be considered to include equivalents in other measurement systems, such as "optical intensity", "RF modulation", "stored charge", etc. As used herein, the term "physical signal" includes any suitable behavior and/or attribute of a physical phenomenon capable of conveying information. Physical signals may be tangible and non-transitory.

What is claimed is:

1. An apparatus comprising:
   an arithmetic unit connected to a plurality of wires of a multi-wire bus comprising four wires, the arithmetic unit comprising at least first and second averaging units connected to first and second pairs of wires of the multi-wire bus, respectively, the first and second pairs of wires being disjoint, the first and second pairs of wires carrying permutations of base vectors (1,0) and (0,−1), respectively, the first and second averaging units configured to generate first and second common mode values respectively based on averages of the base vectors carried by the first and second pairs of wires, respectively; and
   a comparator unit comprising a two-input comparator configured to receive the first and second common mode values from the arithmetic unit, and to responsively form a binary output representing a common mode difference between the received first and second common mode values, the binary output used at least in part in determining a set of output bits.

2. The apparatus of claim 1, wherein the permutations of the base vectors on the first and second pairs of wires of the multi-wire bus correspond to a codeword of a vector signaling code.

3. The apparatus of claim 1, further comprising a sparse comparator unit connected to the multi-wire bus configured to generate second and third binary outputs.

4. The apparatus of claim 3, wherein the sparse comparator unit comprises first and second local two-input comparators connected to the first and second pairs of wires of the multi-wire bus, respectively.

5. The apparatus of claim 1, wherein the first and second pairs of wires are adjacent wires.

6. A method comprising:
   receiving a plurality of signals via wires of a multi-wire bus comprising four wires;
   generating first and second common mode values using first and second averaging units, the first and second averaging units receiving permutations of base vectors (1,0) and (0,−1) on the first and second pairs of wires of the multi-wire bus, respectively, the first and second pairs of wires being disjoint, the first and common mode values corresponding to averages of the base vectors carried by the first and second pairs of wires, respectively; and
   forming a binary output at a comparator unit comprising a two-input comparator, the comparator unit receiving the first and second common mode values from the first and second averaging units, the binary output representing common mode difference between the received first and second common mode values, the binary output used at least in part in determining a set of output bits.

7. The method of claim 6, wherein the permutations of the base vectors on the first and second pairs of wires correspond to symbols of a codeword of a vector signaling code.

8. The method of claim 6, further comprising generating second and third binary outputs using a sparse comparator unit connected to the multi-wire bus.

9. The method of claim 8, wherein the sparse comparator unit comprises first and second local two-input comparators connected to the first and second pairs of wires of the multi-wire bus, respectively.

10. The method of claim 6, wherein the first and pairs of wires are to adjacent wires.

* * * * *